(12) United States Patent
Hatade et al.

(10) Patent No.: US 8,183,631 B2
(45) Date of Patent: May 22, 2012

(54) SEMICONDUCTOR DEVICE

(75) Inventors: Kazunari Hatade, Tokyo (JP); Yoshiaki Hisamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 597 days.

(21) Appl. No.: 11/612,341

(22) Filed: Dec. 18, 2006

(65) Prior Publication Data

US 2007/0096166 A1    May 3, 2007

Related U.S. Application Data

(62) Division of application No. 10/296,220, filed as application No. PCT/JP01/02933 on Apr. 4, 2001, now Pat. No. 7,180,106.

(51) Int. Cl.
*H01L 29/78* (2006.01)
(52) U.S. Cl. .. 257/341; 257/328; 257/335; 257/E29.257
(58) Field of Classification Search .................. 257/328, 257/331, 335, 337, 341, 342, E29.257
See application file for complete search history.

(56) References Cited

U.S. PATENT DOCUMENTS

| 4,789,882 A | 12/1988 | Lidow |
| 5,099,296 A | 3/1992 | Mort et al. |
| 5,191,395 A | 3/1993 | Nishimura |
| 5,208,471 A | 5/1993 | Mori et al. |
| 5,313,088 A | 5/1994 | Takahashi |
| 5,654,560 A * | 8/1997 | Nishizawa et al. ........... 257/139 |
| 5,686,750 A | 11/1997 | Takahashi |
| 5,726,472 A * | 3/1998 | Higashida ...................... 257/341 |
| 6,313,504 B1 | 11/2001 | Furuta et al. .................. 257/335 |

FOREIGN PATENT DOCUMENTS

| EP | 1 063 705 | 12/2000 |
| JP | 63-173373 | 7/1988 |
| JP | 64-22067 | 1/1989 |
| JP | 1-290265 | 11/1989 |
| JP | 4-363068 | 12/1992 |
| JP | 05-198816 | 8/1993 |

(Continued)

OTHER PUBLICATIONS

Office Action issued Nov. 30, 2010 in EP Application No. 01 919 781.3.

(Continued)

*Primary Examiner* — Kenneth Parker
*Assistant Examiner* — Jose R Diaz
(74) *Attorney, Agent, or Firm* — Oblon, Spivak, McClelland, Maier & Neustadt, L.L.P.

(57) ABSTRACT

A semiconductor device has a semiconductor substrate having an upper main surface and a lower main surface. The semiconductor substrate includes a drain layer, a main base region, an underpad base region and a source region. The semiconductor device includes a first main electrode connected to the main base region and the source region and not connected to the underpad base region, a gate electrode opposed to a channel region in the main base region interposed between the drain layer and the source region with a gate insulating film provided therebetween, a conductive gate pad opposed to an exposed surface of the underpad base region in the upper main surface with an insulating layer interposed therebetween and the conductive gate pad is connected to the gate electrode, and a second main electrode connected to the lower main surface.

2 Claims, 23 Drawing Sheets

FOREIGN PATENT DOCUMENTS

| | | |
|---|---|---|
| JP | 8-274321 | 10/1996 |
| JP | 09-252118 | 9/1997 |
| JP | 2000-349288 A | 12/2000 |
| JP | 2001-7322 | 1/2001 |
| JP | 2001-313392 | 11/2001 |

OTHER PUBLICATIONS

Office Action issued Dec. 10, 2010, in Japan Patent Application No. 2002-565148 (with partial English translation).
Office Action issued Aug. 9, 2011, in Chinese Patent Application No. 200910006671.8 (with English Translation).
Extended European Search Report issued on Sep. 26, 2011, in counterpart European Application No. 11 17 4237 (7 pages).
Extended European Search Report issued on Oct. 4, 2011, in counterpart European Application No. 11 17 4230 (7 pages).
Extended European Search Report issued on Oct. 4, 2011, in counterpart European Application No. 11 17 4242 (6 pages).
Extended European Search Report issued on Oct. 4, 2011, in counterpart European Application No. 11 17 4233 (8 pages).
Extended European Search Report issued on Oct. 4, 2011, in counterpart European Application No. 11 17 4240 (8 pages).
Office Action issued Nov. 22, 2011 in Chinese Application No. 200910006671.8 (w/Japanese and Partial English translation).
Office Action issued Mar. 7, 2012 in Chinese Application No. 200910006671.8 (w/partial English translation).

* cited by examiner

F/G. 2

F I G. 17
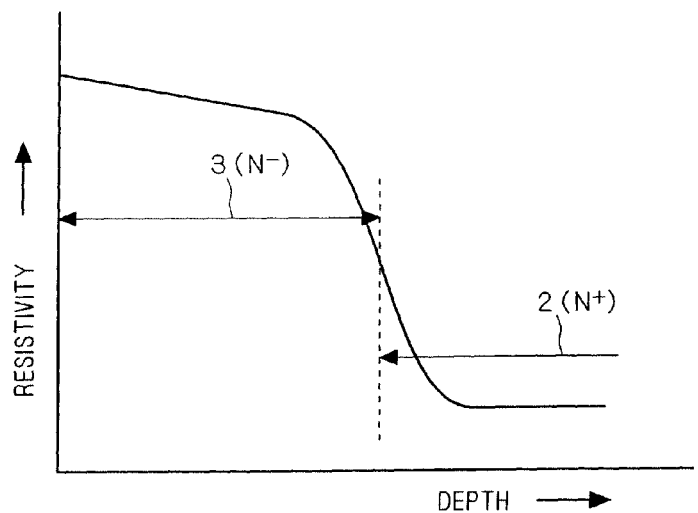
F I G. 18
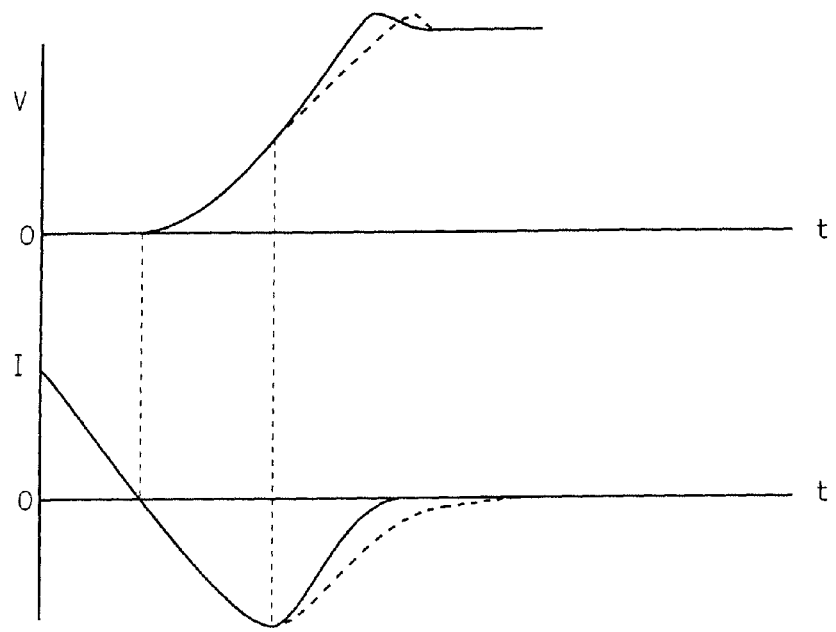

F I G. 19
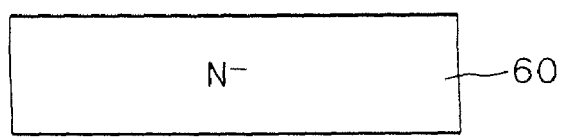
F I G. 20
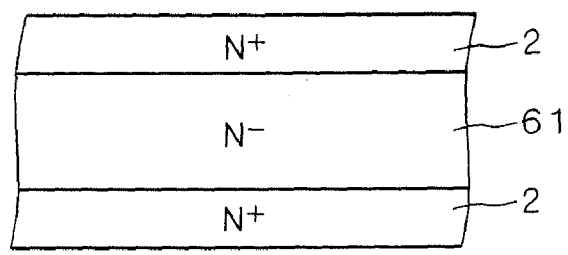
F I G. 21
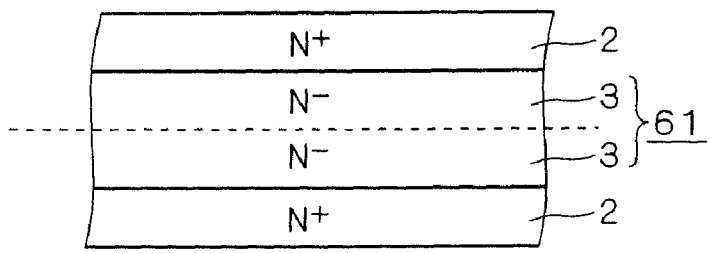

F I G. 24
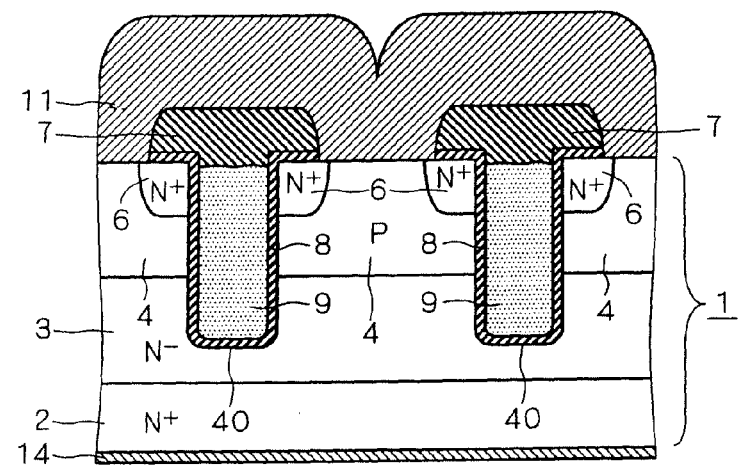

F/G. 26 BACKGROUND ART

SEMICONDUCTOR DEVICE

CROSS REFERENCE TO RELATED APPLICATION

This application is a divisional and claims the benefit of priority under 35 U.S.C. §120 from U.S. application Ser. No. 10/296,220, filed Dec. 2, 2002, which is the National Stage of International Application No. PCT/JP01/02933, filed Apr. 4, 2001. The entire contents of these applications are incorporated herein by reference.

TECHNICAL FIELD

The present invention relates to a semiconductor device.

BACKGROUND ART

In recent years, attention has been paid to an MOSFET and an IGBT as a switching element or an inverter controlling element. FIG. 25 is a plan view showing a conventional typical semiconductor device constituted as the MOSFET. In a semiconductor device 151, an insulating layer is formed on an upper main surface of a semiconductor substrate 71 and a gate pad 86 and a source pad 99 for an electrical connection to an outside are formed thereon. FIG. 26 is a partial enlarged plan view showing the enlarged vicinity of a gate pad 82 in FIG. 25. A source electrode 81 connected to a source pad 99 is provided around the gate pad 82. The source electrode 81 is connected to the semiconductor substrate 71 through a plug 92 penetrating the insulating layer.

FIG. 27 is a sectional view showing the semiconductor device 151 taken along a cutting line C-C in FIG. 26. As shown in FIG. 27, the semiconductor device 151 comprises the semiconductor substrate 71, an insulating layer 77, a gate electrode 79, a conductive layer 80, the source electrode 81, the gate pad 82 and a drain electrode 84. The semiconductor substrate 71 includes an N$^+$ type high concentration drain layer 72, an N$^-$ type drain layer 73, a P type main base region 74, a P type underpad base region 75 and an N$^+$ type source region 76. The semiconductor substrate 71 is a silicon substrate having an upper main surface and a lower main surface.

The drain layer 73 is formed in the upper main surface of the semiconductor substrate 71. The main base region 74 is selectively formed in the drain layer 73 to be shallower than the drain layer 73 and is exposed to the upper main surface. The underpad base region 75 is selectively formed in the drain layer 73 to be shallower than the drain layer 73 and is exposed to the upper surface. The underpad base region 75 is not coupled to the main base region 74 but is isolated from the main base region 74.

The source region 76 is selectively formed in the main base region 74 to be shallower than the main base region 74 and is exposed to the upper main surface. The main base region 74 is divided into a plurality of regions, and similarly, the source region 76 is arranged by a division into a plurality of regions corresponding to the regions of the main base region 74. The source region 76 is not formed in the underpad base region 75. Accordingly, a channel region is not present in the underpad base region 75. The high concentration drain layer 72 is coupled to the lower main surface side of the drain layer 73 and is exposed to the lower main surface of the semiconductor substrate 71.

The source electrode 81 is formed of metal and is connected to the main base region 74 and the source region 76, and furthermore, is connected to the underpad base region 75 through the plug 92 penetrating the insulating layer 77. The gate electrode 79 is formed of polysilicon and is buried in the insulating layer 77 to be opposed to a channel region in the main base region 74 which is interposed between the drain layer 73 and the source region 76 with a gate insulating film 78 to be a part of the insulating layer 77 provided therebetween.

The gate pad 82 is formed of metal and is provided on the insulating layer 77 to be opposed to an exposed surface of the underpad base region 75 in the upper main surface of the semiconductor substrate 71 with the insulating layer 77 provided therebetween. The gate pad 82 is connected to the conductive layer 80 through a plug 83 buried in the insulating layer 77. The conductive layer 80 is connected to the gate electrode 79 through a path which is not shown. The conductive layer 80 is formed of polysilicon and is buried in the insulating layer 77 to be opposed to the upper main surface in a position closer to the upper main surface of the semiconductor substrate 71 than the gate pad 82. The drain electrode 84 is formed of metal and is connected to the lower main surface of the semiconductor substrate 71.

FIG. 28 is a profile of a resistivity in the drain layer 73 and the high concentration drain layer 72 in the semiconductor substrate 71. As shown in FIG. 28, the resistivity is changed like a step in a coupling portion of the drain layer 73 and the high concentration drain layer 72, and is almost uniform in an inner part of each of the drain layer 73 and the high concentration drain layer 72. The profile results from the formation of the semiconductor substrate 71 in accordance with the steps shown in FIGS. 29 and 30. More specifically, in a process for forming the semiconductor substrate 71, a substrate corresponding to the high concentration drain layer 72 is first prepared and the drain layer 73 is then formed by an epitaxial growth method.

Since the semiconductor device 151 is constituted as described above, an operation is carried out in the following manner. When a grounding potential is applied to the source electrode 81, a positive potential is applied to the drain electrode 84 and a gate voltage which is equal to or higher than a threshold voltage is applied to the gate electrode 79 in this state, an inversion layer is formed in the channel region of the main base region 74. As a result, a current flows through the channel region so that the semiconductor device 151 to be an MOSFET is turned ON. If the gate voltage is caused to have a value which is equal to or smaller than the threshold voltage, the inversion layer disappears. Therefore, the semiconductor device 151 is brought into an OFF state.

In the semiconductor device 151, the main base region 74 and the underpad base region 75 are electrically connected to each other through the source electrode 81. Accordingly, a diode to be provided in the MOSFET is formed by a PN junction between the main base region 74 and the drain layer 73 and a PN junction between the underpad base region 75 and the drain layer 73. When the semiconductor device 151 is set in the OFF state, a backward bias is applied to the built-in diode. A voltage to be applied between the source electrode 81 and the drain electrode 84, that is, a drain voltage is held by a depletion layer expanded from the PN junction of the built-in diode toward an inner part of the drain layer 73 when the semiconductor device 151 is set in the OFF state.

When a positive voltage is applied to the source electrode 81 based on an electric potential of the drain electrode 84 in such a state that the source electrode 81 and the gate electrode 79 are short-circuited, a hole is injected from the main base region 74 and the underpad base region 75 which are connected to the source electrode 81 into the drain layer 73. At the same time, an electron is injected from the high concentration drain layer 72 connected to the drain electrode 84 into the drain layer 73. As a result, a current flows from the source electrode 81 to the drain electrode 84. In other words, the built-in diode is brought into the ON state.

Next, when a negative voltage is applied to the source electrode 81 based on the electric potential of the drain electrode 84, the hole remaining in the drain layer 72 is moved to the source electrode 81 and the remaining electron is moved to the drain electrode 84. As a result, a transient current flows from the drain electrode 84 to the source electrode 81. A mobility of the hole is approximately half of that of the electron. Therefore, a time at which a transient current value becomes zero is equal to a time taken until the hole remaining in the drain layer 73 is annihilated. An operation for damping the current flowing transiently in the semiconductor device 151 down to zero is equivalent to a reverse recovery operation of the built-in diode (that is, a recovery operation).

A hole generated in the conduction of the built-in diode depends on areas of the main base region 74 and the underpad base region 75 and their impurity concentrations. It is a matter of course that the area of the underpad base region 75 provided under the gate pad 82 disposed in order to implement an electrical connection to an outside is larger than that of each of the regions obtained by dividing the main base region 74. Accordingly, the remaining hole is generated in a larger amount in the vicinity of the underpad base region 75 than the vicinity of the main base region 74. Therefore, when the built-in diode is caused to carry out the reverse recovery operation with high di/dt, the hole remaining in the vicinity of the underpad base region 75 convergently flows into a specific portion in the main base region 74 which is close to the underpad base region 75 and flows out toward the source electrode 81 through the specific portion. At this time, a parasitic bipolar transistor formed by the source region 76, the main base region 74 and the drain layer 73 is conducted in some cases. More specifically, in the conventional semiconductor device 151, there is a problem in that a tolerance to a change rate di/dt of the current in a process for the reverse recovery operation, that is, a di/dt tolerance is small.

In the semiconductor device 151, furthermore, in the case in which high dV/dt (a change rate of a voltage with the passage of time) is applied to the PN junction between the base regions 74 and 75 constituting the built-in diode and the drain layer 73, for example, in the case in which high dV/dt of approximately 1 kV/μs or more is applied between the drain electrode 84 and the source electrode 81 with the source electrode 81 and the gate electrode 79 short-circuited, a depletion layer is instantaneously expanded in the PN junction between the base regions 74 and 75 and the drain layer 73. At this time, since a hole is generated depending on an area of the PN junction and a speed at which the depletion layer is expanded, a large number of holes are generated around the underpad base region 75 occupying a large area. A current obtained by the generated hole convergently flows into a specific portion in the main base region 74 which is close to the underpad base region 75. As a result, the parasitic bipolar is conducted in some cases. More specifically, the conventional semiconductor device 151 also has a problem in that the di/dt tolerance is small, and furthermore, a tolerance to a change rate dV/dt of the voltage, that is, a dV/dt tolerance is small.

In the semiconductor device 151 shown in FIG. 27, it is also possible to assume a technique for suppressing the conduction of a parasitic bipolar transistor by forming a third base region including no source region 76 between the main base region 74 and the underpad base region 75. However, when di/dt is increased, the hole remaining in the vicinity of the underpad base region 75 flows into the third base region, and furthermore, convergently flows into a specific portion in the main base region 74 which is close to the third base region and flows out toward the source electrode 81 through the specific portion. Consequently, there can be generated such a phenomenon that the parasitic bipolar transistor is conducted. Similarly, there can be generated such a phenomenon that the parasitic bipolar transistor is conducted when dV/dt is increased.

In order to obtain a great di/dt tolerance or a great dV/dt tolerance, moreover, the area of the main base region 74 in which a current flows with the semiconductor device 151 set in the ON state is decreased if a large number of third base regions are formed. More specifically, a channel width over the whole semiconductor device 151 is reduced. As a result, there is another problem in that an ON resistance is increased.

DISCLOSURE OF THE INVENTION

It is an object of the present invention to solve the above-mentioned problems and to provide a semiconductor device capable of enhancing a di/dt tolerance and a dV/dt tolerance without increasing an ON resistance.

In order to achieve the object, a first aspect of the present invention is directed to a semiconductor device including a semiconductor substrate having an upper main surface and a lower main surface, the semiconductor substrate including a drain layer of a first conductivity type formed in the upper main surface, a main base region of a second conductivity type selectively formed in the drain layer to be shallower than the drain layer and exposed to the upper main surface, an underpad base region of a second conductivity type selectively formed in the drain layer to be shallower than the drain layer and exposed to the upper main surface, the underpad base region being not coupled to the main base region and being deeper than the main base region, and a source region of a first conductivity type selectively formed in the main base region to be shallower than the main base region and exposed to the upper main surface, the semiconductor device further comprising a first main electrode connected to the main base region and the source region and not connected to the underpad base region, a gate electrode opposed to a channel region in the main base region interposed between the drain layer and the source region with a gate insulating film provided therebetween, a conductive gate pad opposed to an exposed surface of the underpad base region in the upper main surface with an insulating layer interposed therebetween and connected to the gate electrode, and a second main electrode connected to the lower main surface.

A second aspect of the present invention is directed to the semiconductor device according to the first aspect, wherein the main base region has a lower impurity concentration than that of the underpad base region.

A third aspect of the present invention is directed to a semiconductor device including a semiconductor substrate having an upper main surface and a lower main surface, the semiconductor substrate including a drain layer of a first conductivity type formed in the upper main surface, a main base region of a second conductivity type selectively formed in the drain layer to be shallower than the drain layer and exposed to the upper main surface, the main base region having a projection protruded selectively toward the lower main surface at a bottom face, an underpad base region of a second conductivity type selectively formed in the drain layer to be shallower than the drain layer, exposed to the upper main surface and not coupled to the main base region, and a source region of a first conductivity type selectively formed in the main base region to be shallower than the main base region and exposed to the upper main surface, the semiconductor device further comprising a first main electrode connected to the main base region and the source region and not connected to the underpad base region, a gate electrode opposed to a channel region in the main base region interposed between the drain layer and the source region with a gate insulating film provided therebetween, a conductive gate pad opposed to an exposed surface of the underpad base region in the upper main surface with an insulating layer interposed therebetween and is connected to the gate electrode, and a second main electrode connected to the lower main surface.

A fourth aspect of the present invention is directed to the semiconductor device according to any of the first to third aspects, the semiconductor substrate further including a peripheral base region of a second conductivity type selectively formed in the drain layer to be shallower than the drain layer, being exposed to the upper main surface, the peripheral base region being positioned between the main base region and the underpad base region, not having a semiconductor region of a first conductivity type provided therein, and not coupled to the underpad base region, wherein the first main electrode is also connected to the peripheral base region.

A fifth aspect of the present invention is directed to a semiconductor device including a semiconductor substrate having an upper main surface and a lower main surface, the semiconductor substrate including a drain layer of a first conductivity type formed on the upper main surface, a main base region of a second conductivity type selectively formed in the drain layer to be shallower than the drain layer and exposed to the upper main surface, the main base region being divided into a plurality of regions, an underpad base region of a second conductivity type selectively formed in the drain layer to be shallower than the drain layer, exposed to the upper main surface and not coupled to the main base region, a source region of a first conductivity type selectively formed in the main base region to be shallower than the main base region and exposed to the upper main surface, the source region being divided into a plurality of regions, the plurality of regions of the source region being corresponding to the plurality of regions of the main base region, respectively, and a peripheral base region of a second conductivity type selectively formed in the drain layer to be shallower than the drain layer and exposed to the upper main surface, the peripheral base region having a portion positioned between the main base region and the underpad base region and a portion coupled to one end of each of the regions of the main base region, not having a semiconductor region of a first conductivity type provided therein, and not coupled to the underpad base region, the semiconductor device further comprising a first main electrode connected to the main base region, the source region and the peripheral base region and not connected to the underpad base region, a gate electrode opposed to a channel region in the main base region interposed between the drain layer and the source region with a gate insulating film provided therebetween, a conductive gate pad opposed to an exposed surface of the underpad base region in the upper main surface with an insulating layer interposed therebetween and connected to the gate electrode, and a second main electrode connected to the lower main surface.

A sixth aspect of the present invention is directed to the semiconductor device according to the fifth aspect, wherein the peripheral base region is deeper than the main base region.

A seventh aspect of the present invention is directed to the semiconductor device according to the sixth aspect, wherein the main base region has a lower impurity concentration than that of the peripheral base region.

An eighth aspect of the present invention is directed to a semiconductor device including a semiconductor substrate having an upper main surface and a lower main surface, the semiconductor substrate including a drain layer of a first conductivity type formed in the upper main surface, a main base region of a second conductivity type selectively formed in the drain layer to be shallower than the drain layer and exposed to the upper main surface, a peripheral base region of a second conductivity type selectively formed in the drain layer to be shallower than the drain layer, not having a semiconductor region of a first conductivity type provided therein and exposed to the upper main surface, and a source region of a first conductivity type selectively formed in the main base region to be shallower than the main base region and exposed to the upper main surface, the semiconductor device further comprising a first main electrode connected to the main base region, the source region and the peripheral base region, a gate electrode opposed to a channel region in the main base region interposed between the drain layer and the source region with a gate insulating film provided therebetween, a conductive gate pad opposed to an underpad drain region to be a region in the upper main surface to which the drain layer is exposed and which interposes the peripheral base region in cooperation with the main base region with an insulating layer provided therebetween, and connected to the gate electrode, and a second main electrode connected to the lower main surface.

A ninth aspect of the present invention is directed to the semiconductor device according to the eighth aspect, wherein the main base region is divided into a plurality of regions, the source region is divided into a plurality of regions which correspond to the plurality of regions of the main base region, and the peripheral base region has a portion positioned between the main base region and the underpad drain region and a portion coupled to one end of each of the plurality of regions of the main base region.

A tenth aspect of the present invention is directed to the semiconductor device according to any of the fourth to ninth aspects, wherein the peripheral base region includes an annular portion formed continuously along an outer periphery of a region in the upper main surface which corresponds to a portion provided under the gate pad.

An eleventh aspect of the present invention is directed to the semiconductor device according to any of the first to tenth aspects, wherein a resistivity of the drain layer has such a gradient as to be more decreased when the upper main surface is more distant.

A twelfth aspect of the present invention is directed to a semiconductor device including a semiconductor substrate having an upper main surface and a lower main surface, the semiconductor substrate including a drain layer of a first conductivity type formed in the upper main surface and having a resistivity with such a gradient as to be more decreased when the upper main surface is more distant, a main base region of a second conductivity type selectively formed in the drain layer to be shallower than the drain layer and exposed to the upper main surface, an underpad base region of a second conductivity type selectively formed in the drain layer to be shallower than the drain layer, exposed to the upper main surface and not coupled to the main base region, and a source region of a first conductivity type selectively formed in the main base region to be shallower than the main base region and exposed to the upper main surface, the semiconductor device further comprising a first main electrode connected to the main base region and the source region and not connected to the underpad base region, a gate electrode opposed to a channel region in the main base region interposed between the drain layer and the source region with a gate insulating film provided therebetween, a conductive gate pad opposed to an exposed surface of the underpad base region in the upper main surface with an insulating layer interposed therebetween and is connected to the gate electrode, and a second main electrode connected to the lower main surface.

A thirteenth aspect of the present invention is directed to a semiconductor device including a semiconductor substrate having an upper main surface and a lower main surface, the semiconductor substrate including a drain layer of a first conductivity type which in the upper main surface and having a resistivity with such a gradient as to be more decreased when the upper main surface is more distant, a main base region of a second conductivity type selectively formed in the drain layer to be shallower than the drain layer and exposed to the upper main surface, and a source region of a first conductivity type selectively formed in the main base region to be shallower than the main base region and exposed to the upper main surface, the semiconductor device further comprising a first main electrode connected to the main base region and the source region, a gate electrode opposed to a channel region in the main base region interposed between the drain layer and the source region with a gate insulating film provided therebetween, a conductive gate pad opposed to an underpad drain region in the upper main surface to which the drain layer is exposed with an insulating layer interposed therebetween, and connected to the gate electrode, and a second main electrode connected to the lower main surface.

A fourteenth aspect of the present invention is directed to a semiconductor device including a semiconductor substrate having an upper main surface and a lower main surface, the semiconductor substrate including a drain layer of a first conductivity type formed in the upper main surface and having a resistivity with such a gradient as to be more decreased when the upper main surface is more distant, a main base region of a second conductivity type selectively formed in the drain layer to be shallower than the drain layer and exposed to the upper main surface, an underpad base region of a second conductivity type selectively formed in the drain layer to be shallower than the drain layer, exposed to the upper main surface and not coupled to the main base region, a source region of a first conductivity type selectively formed in the main base region to be shallower than the main base region and exposed to the upper main surface, and a peripheral base region of a second conductivity type selectively formed in the drain layer to be shallower than the drain layer, exposed to the upper main surface, the peripheral base region being positioned between the main base region and the underpad base region, having a semiconductor region of a first conductivity type provided therein and being not coupled to the underpad base region, the semiconductor device further comprising a first main electrode connected to the main base region, the source region and the peripheral base region and not connected to the underpad base region, a gate electrode opposed to a channel region in the main base region interposed between the drain layer and the source region with a gate insulating film provided therebetween, a conductive gate pad opposed to an exposed surface of the underpad base region in the upper main surface with an insulating layer interposed therebetween and connected to the gate electrode, and a second main electrode connected to the lower main surface.

A fifteenth aspect of the present invention is directed to the semiconductor device according to any of the first to fourteenth aspects, further including a conductive layer buried in the insulating layer to be opposed to the upper main surface in a position closer to the upper main surface than the gate pad.

A sixteenth aspect of the present invention is directed to the semiconductor device according to any of the fourth to ninth, tenth and fourteenth aspects, further including a conductive layer buried in the insulating layer to be opposed to the upper main surface in a position closer to the upper main surface than the gate pad, wherein the conductive layer being extended to reach a portion provided above the peripheral base region.

A seventeenth aspect of the present invention is directed to the semiconductor device according to the fifteenth or sixteenth aspect, wherein the conductive layer is connected to the gate pad.

An eighteenth aspect of the present invention is directed to a semiconductor device including a semiconductor substrate having an upper main surface and a lower main surface, the semiconductor substrate including a drain layer of a first conductivity type formed in the upper main surface, a main base region of a second conductivity type selectively formed in the drain layer to be shallower than the drain layer and exposed to the upper main surface, and a source region of a first conductivity type selectively formed in the main base region to be shallower than the main base region and exposed to the upper main surface, the semiconductor device further comprising a first main electrode connected to the main base region and the source region, a gate electrode opposed to a channel region in the main base region interposed between the drain layer and the source region with a gate insulating film provided therebetween, a conductive gate pad opposed to an underpad drain region in the upper main surface to which the drain layer is exposed with an insulating layer interposed therebetween, and connected to the gate electrode, a conductive layer buried in the insulating layer to be opposed to the upper main surface in a position closer to the upper main surface than the gate pad and connected to the gate pad, and a second main electrode connected to the lower main surface.

A nineteenth aspect of the present invention is directed to the semiconductor device according to any of the first to ninth aspects, wherein a semiconductor region of a second conductivity type which is connected to the source electrode and is exposed to the upper main surface is formed in only a region shifted from a portion provided under the gate pad.

In the semiconductor device according to the first aspect of the present invention, the underpad base region is not connected to the first main electrode and is not coupled to the main base region connected to the first main electrode. More specifically, the underpad base region is set in a floating state. Accordingly, a diode (referred to as a built-in diode) provided in the semiconductor device is only a PN junction between the main base region and the drain layer. When a forward voltage is applied to the built-in diode, that is, the built-in diode is conducted, a carrier is injected from the main base region into the drain layer and is not injected from the underpad base region set in the floating state. Therefore, it is possible to suppress such a phenomenon that the residual carrier convergently flows into a specific portion in the main base region which is close to the underpad base region when the built-in diode carries out a reverse recovery operation, that is, a backward voltage (that is, a backward bias) is applied to the built-in diode. As a result, even if the built-in diode is caused to carry out the reverse recovery operation with high di/dt, a parasitic bipolar transistor formed by the source region, the main base region and the drain layer is conducted with difficulty. Consequently, a di/dt tolerance of the semiconductor device can be enhanced.

Since the underpad base region is set in the floating state, a depletion layer is expanded from the main base region connected to the first main electrode to an inner part of the drain layer when the backward bias is applied to the built-in diode. After the expanded depletion layer reaches the underpad base region, the depletion layer is expanded from the underpad base region toward the inner part of the drain layer. The depletion layer is not connected from the main base region to the underpad base region until the backward bias is increased to some extent. Accordingly, a speed at which the depletion layer is expanded is also decreased comparatively.

Even if the built-in diode is caused to carry out the reverse recovery operation with high di/dt, the speed at which the depletion layer is expanded is decreased in the vicinity of the PN junction between the underpad base region and the drain layer. Therefore, the carrier remaining in the drain layer does not convergently flow into a specific portion in the main base region which is close to the underpad base region but uniformly flows into the whole main base region comparatively gently. Accordingly, since the conduction of the parasitic bipolar transistor is suppressed, the di/dt tolerance of the semiconductor device can further be enhanced.

Furthermore, in the case in which high dV/dt (a change rate of a voltage with the passage of time) is applied to the PN junction between the main base region and the drain layer which constitute the built-in diode, for example, in the case in which high dV/dt of approximately 1 kV/µs or more is applied between the second main electrode and the first main electrode with the gate electrode and the first main electrode short-circuited, the depletion layer is instantaneously expanded in the PN junction between the main base region and the drain layer so that a carrier is generated depending on an area of the PN junction and a speed at which the depletion layer is expanded. On the other hand, the underpad base region is set in the floating state in the PN junction between the underpad base region and the drain layer. Consequently, the speed at which the depletion layer is expanded is decreased so that the carrier to be generated is comparatively lessened. As a result, it is possible to suppress such a phenomenon that a current caused by the generation of the carrier convergently flows into the specific portion in the main base region which is close to the underpad base region. Consequently, the parasitic bipolar transistor constituted by the source region, the main base region and the drain layer is conducted with difficulty. Therefore, the dV/dt tolerance of the semiconductor device can be enhanced. Alternatively, it is possible to suppress such a phenomenon that the current caused by the generation of the carrier convergently flows into the gate electrode through the gate insulating film positioned in the vicinity of the underpad base region. Therefore, the gate insulating film provided in the vicinity of the underpad base region is influenced by the current with difficulty so that the dV/dt tolerance of the semiconductor device can be enhanced.

A voltage to be applied between the second and first main electrodes (that is, a voltage between the main electrodes) is held by the depletion layer expanded from the PN junction between the main base region and the drain layer toward the drain layer when an inversion layer is not formed in the channel region of the main base region, that is, the semiconductor device is set in an OFF state. A maximum value of the voltage to be held specifies a breakdown voltage of the semiconductor device. In the semiconductor device according to the first aspect, since the main base region is formed to be shallower than the underpad base region, an effective distance at which the depletion layer is expanded from the PN junction between the main base region and the drain layer toward the inner part of the drain layer is increased. Consequently, the breakdown voltage of the semiconductor device can be enhanced.

In the semiconductor device according to the second aspect of the present invention, the impurity concentration of the main base region is lower than that of the underpad base region. Therefore, when the semiconductor device is set in the OFF state, the depletion layer holding the voltage between the main electrodes is easily expanded toward an inner part of the main base region. As a result, an electric field strength in the depletion layer is relieved, and particularly, an electric field strength of a curved portion in the main base region is relieved. Consequently, the breakdown voltage can further be enhanced.

In the semiconductor device according to the third aspect of the present invention, the underpad base region is not connected to the first main electrode and is not coupled to the main base region connected to the first main electrode. More specifically, the underpad base region is set in a floating state. In the same manner as in the semiconductor device according to the first aspect, accordingly, a high di/dt tolerance and a high dV/dt tolerance can be realized. When the semiconductor device having an inductive load connected thereto is turned OFF, a surge voltage appears in the voltage between the main electrodes. When the surge voltage exceeds the breakdown voltage, an avalanche current flows to the semiconductor substrate. The avalanche current contributes as a base current of a parasitic bipolar transistor formed by the source region, the main base region and the drain layer. In the conventional semiconductor device, therefore, the parasitic bipolar transistor is conducted due to the avalanche current in some cases. In the semiconductor device according to the third aspect, however, the projection is provided in the main base region. Therefore, an electric field generated in the depletion layer is selectively increased in the projection. For this reason, the avalanche current concentrates in the projection provided in a bottom portion of the main base region so that a component to contribute as a base current of the parasitic bipolar transistor is reduced. As a result, the conduction of the parasitic bipolar transistor is suppressed.

In the semiconductor device according to the fourth aspect of the present invention, the peripheral base region is provided between the main base region and the underpad base region. The peripheral base region is the same as the main base region in that it is not coupled to the underpad base region but is connected to the first main electrode. Accordingly, a built-in diode is constituted by a PN junction between the main base region and the drain layer and a PN junction between the peripheral base region and the drain layer.

Even if carriers are injected from the underpad base region into the drain layer when the built-in diode is conducted, the residual carriers mainly flow to the first main electrode through the peripheral base region in place of the main base region when the built-in diode carries out the reverse recovery operation. Furthermore, the residual carriers generated from a portion in the main base region which is close to the peripheral base region flow to the first main electrode through the peripheral base region in addition to the main base region. Thus, it is possible to suppress such a phenomenon that the residual carriers convergently flow into a specific portion in the main base region which is close to the underpad base region when the built-in diode carries out the reverse recovery operation. Consequently, the residual carriers can be annihilated efficiently.

Since a semiconductor region of a first conductivity type is not formed in the peripheral base region differently from the main base region, a parasitic bipolar transistor is not constituted. Accordingly, the residual carriers flowing through the peripheral base region do not contribute as a base current of the parasitic bipolar transistor. As a result, even if the built-in diode is caused to carry out the reverse recovery operation with high di/dt, the conduction of the parasitic bipolar transistor can be suppressed so that the di/dt tolerance of the semiconductor device can further be enhanced.

Moreover, in the case in which high dV/dt is applied to the PN junction between the main base region and the drain layer which constitute the built-in diode, for example, in the case in which high dV/dt of approximately 1 kV/µs or more is applied between the second main electrode and the first main electrode with the gate electrode and the first main electrode short-circuited, a current obtained by the generated carrier flows to the first main electrode through the peripheral base region positioned in the vicinity of the underpad base region in addition to the fact that the number of the generated carriers is small because the underpad base region is set in the floating state.

As a result, it is possible to further suppress such a phenomenon that the current convergently flows into a specific portion in the main base region which is close to the underpad base region. Consequently, the parasitic bipolar transistor constituted by the source region, the main base region and the drain layer is conducted with difficulty. Therefore, the dV/dt tolerance of the semiconductor device can further be enhanced. Alternatively, it is possible to suppress such a phenomenon that a current caused by the generation of the carrier convergently flows into the gate electrode through the gate insulating film positioned in the vicinity of the underpad base region. Consequently, the gate insulating film provided in the vicinity of the underpad base region is influenced by the current with difficulty so that the dV/dt tolerance of the semiconductor device can further be enhanced.

In the semiconductor device according to the fifth aspect of the present invention, the underpad base region is not connected to the first main electrode and is not coupled to the main base region connected to the first main electrode. More specifically, the underpad base region is set in the floating state. In the same manner as in the semiconductor device according to the first aspect, accordingly, a high di/dt tolerance and a high dV/dt tolerance can be realized. Moreover, since the peripheral base region is provided between the main base region and the underpad base region, the di/dt tolerance and the dV/dt tolerance can further be increased in the same manner as in the semiconductor device according to the fourth aspect.

When the built-in diode constituted by the PN junction between the main base region and the drain layer and the PN junction between the peripheral base region and the drain layer is conducted, the carrier is injected from the main base region and the peripheral base region into the drain layer. The peripheral base region is coupled to one end of each of a plurality of regions in the main base region. Therefore, also when the built-in diode is caused to carry out the reverse recovery operation with high di/dt, it is possible to effectively relieve such a phenomenon that the residual carrier convergently flows to the specific portion of the main base region. Thus, the residual carrier flows over the whole main base region and peripheral base region comparatively uniformly. As a result, the di/dt tolerance can further be increased.

In the semiconductor device according to the sixth aspect of the present invention, since the main base region is formed to be shallower than the underpad base region, the breakdown voltage of the semiconductor device can be increased in the same manner as in the semiconductor device according to the first aspect.

In the semiconductor device according to the seventh aspect of the present invention, since the impurity concentration of the main base region is lower than that of the underpad base region, the breakdown voltage of the semiconductor device can be increased in the same manner as in the semiconductor device according to the second aspect.

In the semiconductor device according to the eighth aspect of the present invention, the peripheral base region is provided between the main base region and the underpad drain region. The peripheral base region is the same as the main base region in that it is connected to the first main electrode. Accordingly, a built-in diode is constituted by the PN junction between the main base region and the drain layer and the PN junction between the peripheral base region and the drain layer. The carrier generated in a portion in the main base region which is close to the peripheral base region in the conduction of the built-in diode flows to the first main electrode through the peripheral base region as well as the main base region when the built-in diode carries out the reverse recovery operation.

Thus, it is possible to suppress such a phenomenon that the residual carriers convergently flow into a specific portion in the main base region which is close to the peripheral base region when the built-in diode carries out the reverse recovery operation. Since a semiconductor region of a first conductivity type is not formed in the peripheral base region differently from the main base region, a parasitic bipolar transistor is not constituted. Accordingly, the residual carriers flowing through the peripheral base region do not contribute as a base current of the parasitic bipolar transistor. As a result, even if the built-in diode is caused to carry out the reverse recovery operation with high di/dt, the conduction of the parasitic bipolar transistor can be suppressed so that the di/dt tolerance of the semiconductor device can further be enhanced. Moreover, the gate pad is opposed to the drain layer, which contributes to an enhancement in the dV/dt tolerance.

In the semiconductor device according to the ninth aspect of the present invention, the peripheral base region is coupled to one end of each of the regions of the main base region. In the same manner as in the semiconductor device according to the fifth aspect, therefore, the di/dt tolerance can further be increased.

In the semiconductor device according to the tenth aspect of the present invention, the peripheral base region includes an annular portion along an outer periphery of a region corresponding to a portion provided under the gate pad. Therefore, the carrier generated from the main base region in the conduction of the built-in diode flows to the peripheral base region efficiently when the built-in diode carries out the reverse recovery operation. Accordingly, it is possible to suppress such a phenomenon that the residual carrier convergently flows into a specific portion in the main base region which is close to the region corresponding to the portion provided under the gate pad when the built-in diode is caused to carry out the reverse recovery operation with high di/dt. Consequently, the di/dt tolerance can further be enhanced.

In the semiconductor device according to the eleventh aspect of the present invention, the resistivity of the drain layer has such a gradient as to be more decreased when the upper main surface of the semiconductor substrate is more distant. Consequently, when the built-in diode carries out the reverse recovery operation, a speed at which a depletion layer is expanded is more decreased when the depletion layer is more expanded. Therefore, a voltage change rate dV/dt is reduced when the built-in diode carries out the reverse recovery operation. More specifically, a change in a voltage to be applied between the main electrodes becomes gentle. Even if the carriers remain in a region provided under a gate pad, accordingly, it is possible to suppress such a phenomenon that the residual carriers convergently flow into a specific portion in the main base region which is close to the region provided under the gate pad. As a result, the residual carriers flow comparatively uniformly over the whole main base region by taking time. Consequently, even if the built-in diode is caused to carry out the reverse recovery operation with high di/dt, a parasitic bipolar transistor is conducted with difficulty. Therefore, the di/dt tolerance of the semiconductor device can be enhanced. In addition, since a speed at which the depletion layer is expanded toward the inner part of the drain layer is decreased, the dV/dt tolerance of the semiconductor device can also be enhanced.

Furthermore, when the built-in diode is caused to carry out the reverse recovery operation with high di/dt, the speed at which the depletion layer is expanded is decreased so that the voltage change rate dV/dt is also reduced. Accordingly, since a change in a voltage between the main electrodes becomes gentle, the reverse recovery operation approximates to a soft recovery. Consequently, it is possible to relieve or suppress such a phenomenon that a surge voltage is generated between the main electrodes.

In addition, since the resistivity of the drain layer is more decreased when the upper main surface of the semiconductor substrate is more distant, a bulk resistance of the drain layer is reduced. Accordingly, it is also possible to obtain such an effect that an ON resistance of the semiconductor device is reduced.

In the semiconductor device according to the twelfth aspect of the present invention, the underpad base region is not connected to the first main electrode and is not coupled to the main base region connected to the first main electrode. More specifically, the underpad base region is set in a floating state. In the same manner as in the semiconductor device according to the first aspect, accordingly, a high di/dt tolerance and a high dV/dt tolerance can be realized. Moreover, the resistivity of the drain layer has such a gradient as to be more decreased when the upper main surface of the semiconductor substrate is more distant. In the same manner as in the semiconductor device according to the eleventh aspect, therefore, it is possible to further enhance a di/dt tolerance, to relieve generation of a surge voltage and to reduce an ON resistance.

In the semiconductor device according to the thirteenth aspect of the present invention, the resistivity of the drain layer has such a gradient as to be more decreased when the upper main surface of the semiconductor substrate is more distant. In the same manner as in the semiconductor device according to the eleventh aspect, therefore, it is possible to enhance the di/dt tolerance, to relieve the generation of the surge voltage and to reduce the ON resistance. Moreover, since the gate pad is opposed to the drain layer, the dV/dt tolerance can be enhanced.

In the semiconductor device according to the fourteenth aspect of the present invention, the underpad base region is not connected to the first main electrode and is not coupled to the main base region connected to the first main electrode. More specifically, the underpad base region is set in the floating state. In the same manner as in the semiconductor device according to the first aspect, accordingly, a high di/dt tolerance and a high dV/dt tolerance can be realized. Moreover, the peripheral base region is provided between the main base region and the underpad base region. In the same manner as in the semiconductor device according to the fourth aspect, therefore, the di/dt tolerance and the dV/dt tolerance can further be increased. Furthermore, the resistivity of the drain layer has such a gradient as to be more decreased when the upper main surface of the semiconductor substrate is more distant. In the same manner as in the semiconductor device according to the eleventh aspect, therefore, it is possible to further enhance the di/dt tolerance, to relieve the generation of the surge voltage and to reduce the ON resistance.

In the semiconductor device according to the fifteenth aspect of the present invention, the conductive layer is buried in the insulating layer provided under the gate pad to be opposed to the upper main surface of the semiconductor substrate. For this reason, when a backward bias is applied to the built-in diode, the depletion layer is expanded toward the inner part of the drain layer while holding an almost parallel configuration with the upper main surface in a region provided under the gate pad. More specifically, the expansion of the depletion layer toward the inner part of the drain layer becomes almost uniform in the region provided under the gate pad. Accordingly, a part in which a critical electric field strength is reached is generated with difficulty. Therefore, the breakdown voltage of the semiconductor device can be enhanced.

In the semiconductor device according to the sixteenth aspect of the present invention, the conductive layer is buried in the insulating layer provided under the gate pad to be opposed to the upper main surface of the semiconductor substrate. In addition, the conductive layer is extended to reach a portion provided above the peripheral base region. For this reason, when a backward bias is applied to the built-in diode, the depletion layer to be expanded to the inner part of the drain layer quickly reaches one of ends of the peripheral base region when reaching the other end. More specifically, the depletion layer is expanded while holding an almost parallel configuration with the upper main surface including the periphery of the peripheral base region. Accordingly, since the expansion of the depletion layer effectively becomes almost uniform, it is possible to effectively suppress the generation of a portion in which a critical electric field strength is reached. As a result, the breakdown voltage of the semiconductor device can be increased effectively.

In the semiconductor device according to the seventeenth aspect of the present invention, the conductive layer is connected to the gate pad. Therefore, it is possible to further enhance such an effect that a depletion layer is expanded to the inner part of the drain layer while maintaining a parallel configuration with the upper main surface in a region provided under the gate pad when a backward bias is applied to the built-in diode. As a result, the breakdown voltage of the semiconductor device can further be enhanced.

In the semiconductor device according to the eighteenth aspect of the present invention, the conductive layer is connected to the gate pad. In the same manner as in the semiconductor device according to the seventeenth aspect, therefore, the breakdown voltage of the semiconductor device can be increased effectively. Moreover, since the gate pad is opposed to the drain layer, the dV/dt tolerance can be enhanced.

In the semiconductor device according to the nineteenth aspect of the present invention, the semiconductor region of a second conductivity type which is connected to the first main electrode and is exposed to the upper main surface of the semiconductor substrate is formed in only the region shifted from the portion provided under the gate pad. Therefore, even if the carriers remain in the region provided under the gate pad, it is possible to effectively suppress such a phenomenon that the residual carriers convergently flow into the specific portion in the main base region which is close to the region provided under the gate pad. As a result, even if the built-in diode is caused to carry out the reverse recovery operation with high di/dt, a parasitic bipolar transistor is conducted with difficulty. Therefore, the di/dt tolerance of the semiconductor device can be increased more effectively.

The object, features, aspects and advantages of the present invention will be more apparent from the following detailed description and the accompanying drawings.

BRIEF DESCRIPTION OF THE DRAWINGS

FIG. 17 is a graph showing a feature of a semiconductor device according to a fifth embodiment, FIG. 18 is a waveform diagram showing an operation of the semiconductor device according to the fifth embodiment, FIGS. 19 to 21 are views showing a process for manufacturing the semiconductor device according to the fifth embodiment, FIG. 24 is a longitudinal sectional view showing a semiconductor device according to a further variant.

BEST MODE FOR CARRYING OUT THE INVENTION

First Embodiment

Figure 1:
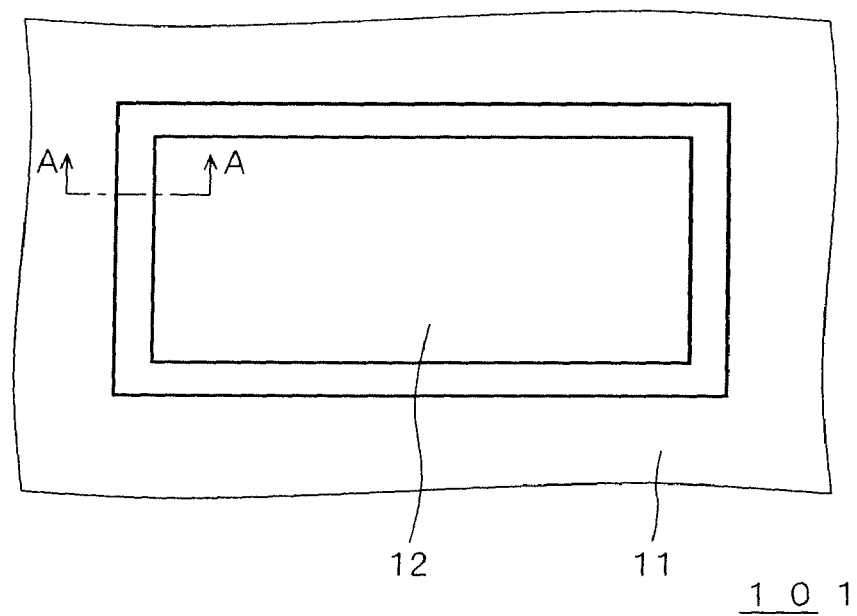
FIG. 1 is a partial plan view showing a semiconductor device according to a first embodiment.
Figure 2:
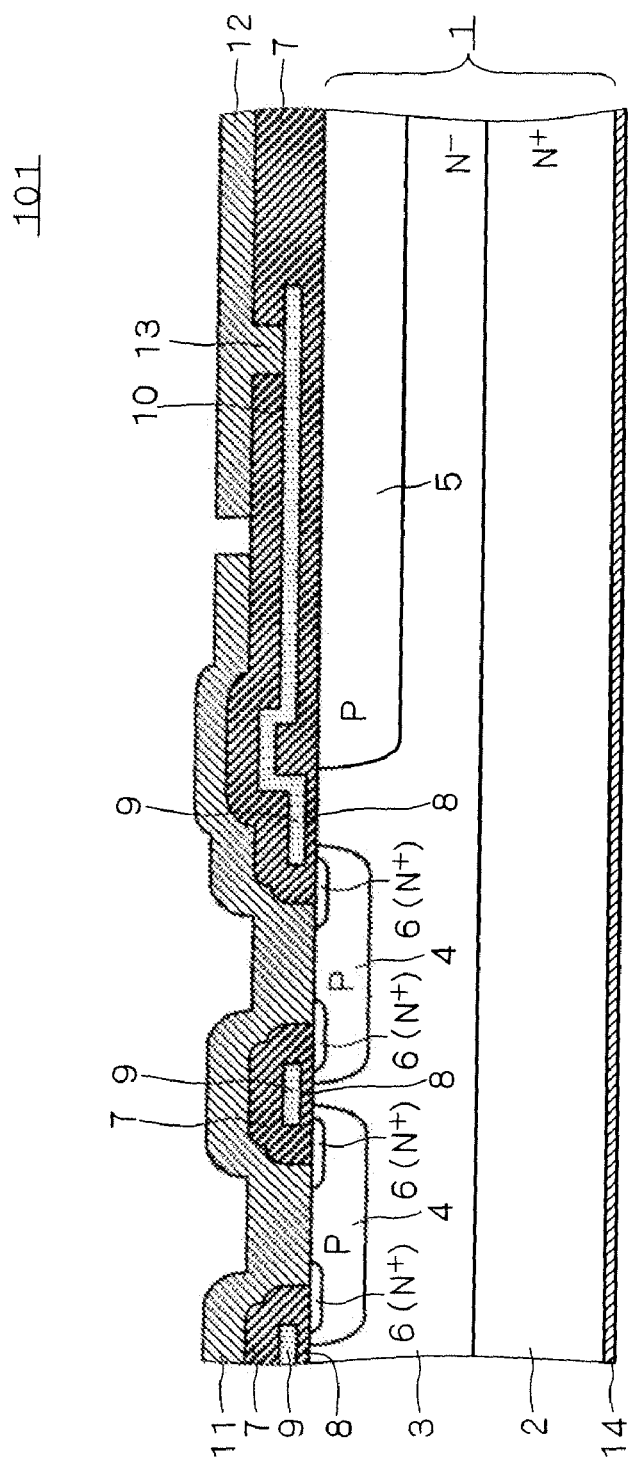
FIG. 2 is a longitudinal sectional view showing the semiconductor device according to the first embodiment.
Figure 25:
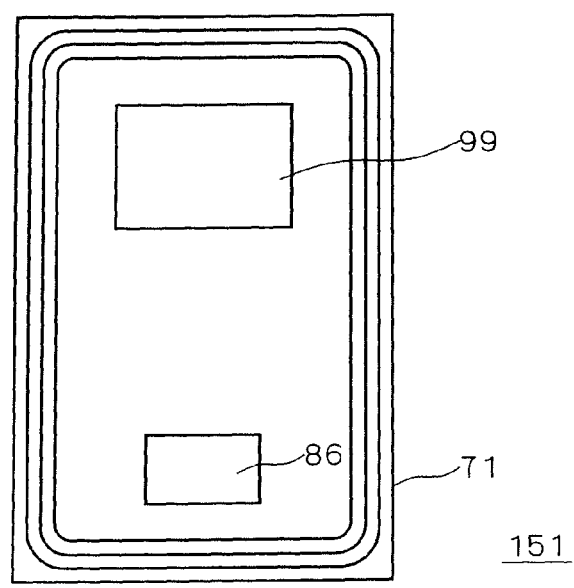
FIG. 25 is a plan view showing a semiconductor device according to a conventional art.
Figure 26:
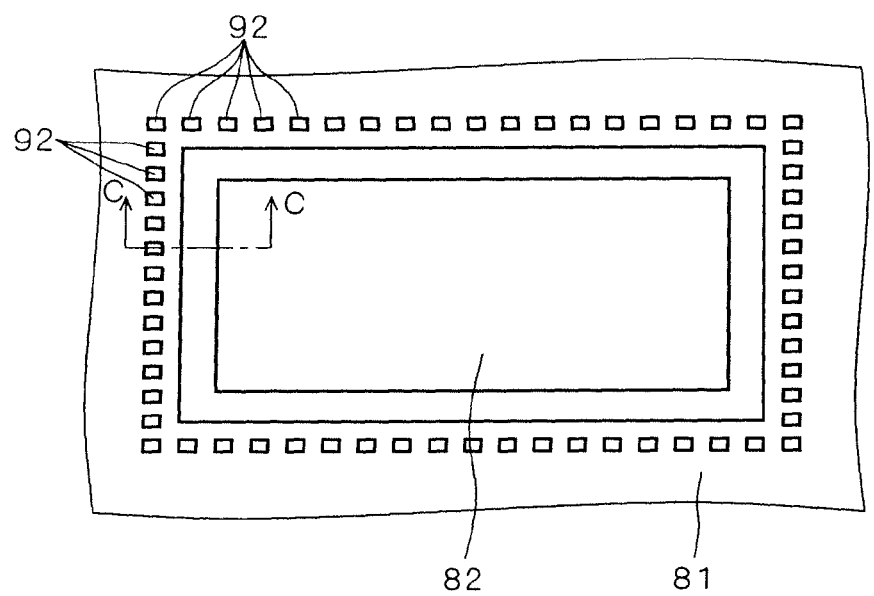
FIG. 26 is a partial plan view showing the semiconductor device according to the conventional art.
Figure 27:
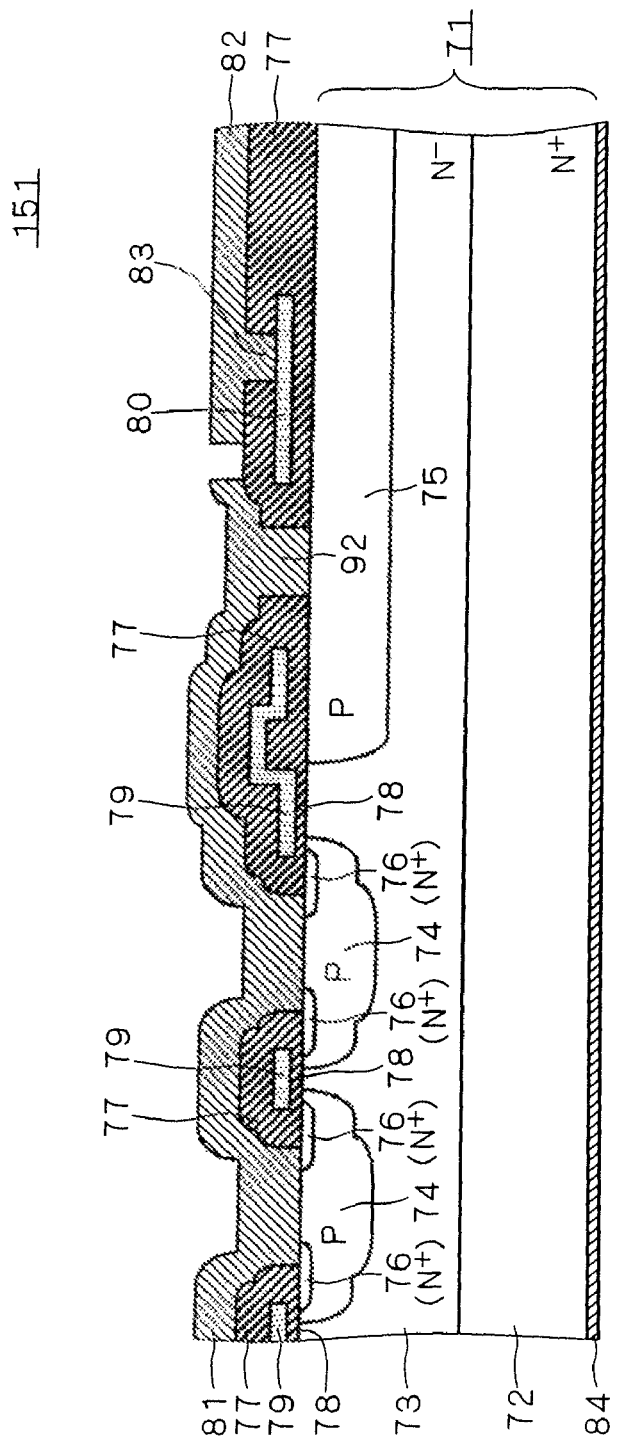
FIG. 27 is a longitudinal sectional view showing the semiconductor device according to the conventional art.
Figure 28:
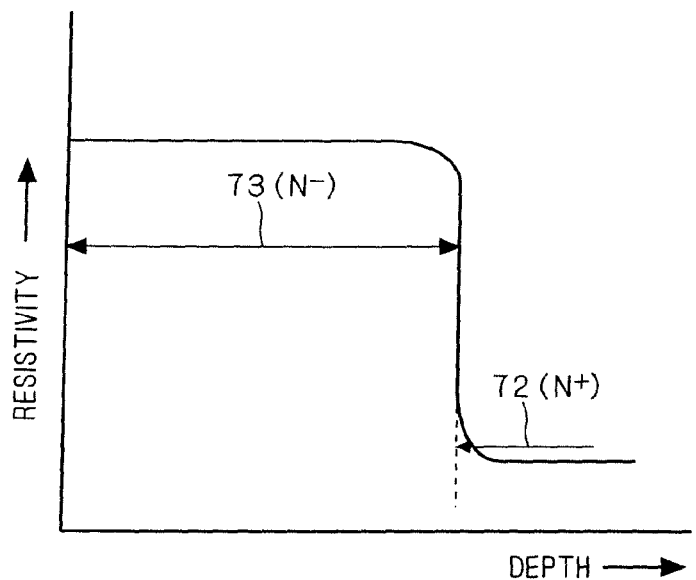
FIG. 28 is a graph showing a feature of the semiconductor device according to the conventional art.
Figure 29:
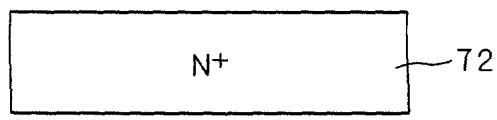
FIGS. 29 and 30 are views showing a process for manufacturing the semiconductor device according to the conventional art.
Figure 30:
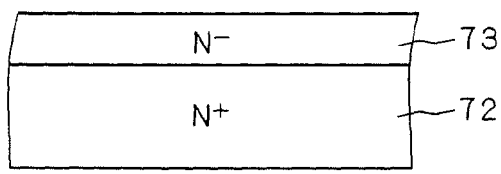

FIG. 1 is a partial plan view showing a part of a semiconductor device according to a first embodiment of the present invention which is constituted as an MOSFET. The whole plan view of the semiconductor device 101 is the same as FIG. 25, for example. As shown in FIG. 1, a source electrode 11 is provided around a gate pad 12. FIG. 2 is a sectional view showing the semiconductor device 101 taken along a cutting line A-A in FIG. 1. As shown in FIG. 2, the semiconductor device 101 comprises a semiconductor substrate 1, an insulating layer 7, a gate electrode 9, a conductive layer 10, the source electrode 11, the gate pad 12 and a drain electrode 14. The semiconductor substrate 1 includes an $N^+$ type high concentration drain layer 2, an $N^-$ type drain layer 3, a P type main base region 4, a P type underpad base region 5 and an $N^+$ type source region 6. The semiconductor substrate 1 is a silicon substrate having an upper main surface and a lower main surface.

The drain layer 3 is formed in the upper main surface of the semiconductor substrate 1. The main base region 4 is selectively formed in the drain layer 3 to be shallower than the drain layer 3 and is exposed to the upper main surface. The underpad base region 5 is selectively formed in the drain layer 3 to be shallower than the drain layer 3 and is exposed to the upper main surface. The underpad base region 5 is not coupled to the main base region 4 but is isolated from the main base region 4. The main base region 4 is formed to be shallower than the underpad base region 5.

The source region 6 is selectively formed in the main base region 4 to be shallower than the main base region 4 and is exposed to the upper main surface. The main base region 4 is divided into a plurality of regions, and similarly, the source region 6 is arranged by a division into a plurality of regions corresponding to the regions of the main base region 4. The source region 6 is not formed in the underpad base region 5. Accordingly, a channel region is not present in the underpad base region 5. The high concentration drain layer 2 is coupled to the lower main surface side of the drain layer 3 and is exposed to the lower main surface of the semiconductor substrate 1.

The source electrode 11 is formed of metal and is connected to the main base region 4 and the source region 6. However, the source electrode 11 is not connected to the underpad base region 5 differently from the conventional semiconductor device 151. The gate electrode 9 is formed of polysilicon and is buried in the insulating layer 7 to be opposed to a channel region in the main base region 4 which is interposed between the drain layer 3 and the source region 6 with the gate insulating film to be a part of the insulating layer 7 provided therebetween.

The gate pad 12 is formed of metal and is provided on the insulating layer 7 to be opposed to an exposed surface of the underpad base region 5 in the upper main surface of the semiconductor substrate 1 with the insulating layer 7 provided therebetween. The gate pad 12 is connected to the conductive layer 10 through a plug 13 buried in the insulating layer 7, and furthermore, is connected to the gate electrode 9 coupled to the conductive layer 10. The conductive layer 10 is formed of polysilicon and is buried in the insulating layer 7 to be opposed to the upper main surface in a position closer to the upper main surface of the semiconductor substrate 1 than the gate pad 12. Moreover, the conductive layer 10 is extended to reach an upper part of the main base region 4. A drain electrode 14 is formed of metal and is connected to the lower main surface of the semiconductor substrate 1.

Since the semiconductor device 101 is constituted as described above, it is operated in the following manner. In the semiconductor device 101, the underpad base region 5 is not connected to the source electrode 11 and is not coupled to the main base region 4 connected to the source electrode 11. More specifically, the underpad base region 5 is set in a floating state. Accordingly, a diode provided in the semiconductor device 101 is only a PN junction between the main base region 4 and the drain layer 3. When a forward voltage is applied to the built-in diode, that is, the built-in diode is conducted, a hole is injected from the main base region 4 into the drain layer 3 and is not injected from the underpad base region 5 set in the floating state. Therefore, it is possible to suppress such a phenomenon that a remaining hole convergently flows into a specific portion in the main base region 4 which is close to the underpad base region 5 when the built-in diode carries out a reverse recovery operation, that is, a backward bias is applied to the built-in diode. As a result, even if the built-in diode is caused to carry out the reverse recovery operation with high di/dt, a parasitic bipolar transistor formed by the source region 6, the main base region 4 and the drain layer 3 is conducted with difficulty. Consequently, a di/dt tolerance of the semiconductor device 101 can be enhanced.

Figure 3:
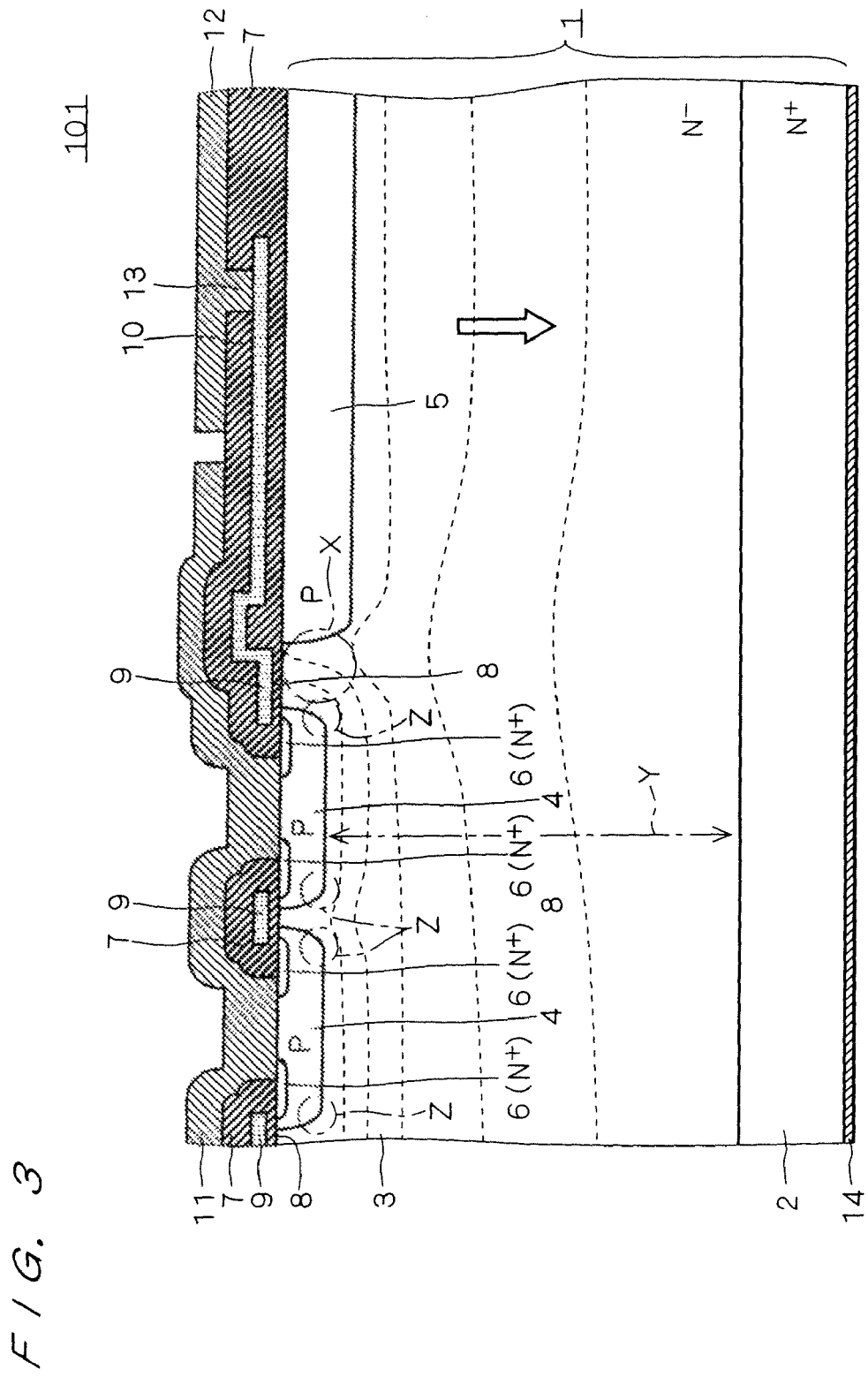
FIG. 3 is a view illustrating an operation of the semiconductor device according to the first embodiment.

Moreover, since the underpad base region 5 is set in the floating state, a depletion layer is expanded from the main base region 4 connected to the source electrode 11 to an inner part of the drain layer 3 as shown in FIG. 3 when a backward bias is applied to the built-in diode. In FIG. 3, a front of the expanded depletion layer is shown in a dotted line and an arrow indicates a direction in which the front advances. After the expanded depletion layer reaches the underpad base region 5, the depletion layer is expanded from the underpad base region 5 toward the inner part of the drain layer 3. The depletion layer is not connected from the main base region 4 to the underpad base region 5 until the backward bias is increased to some extent. In FIG. 3, the foregoing is signified by the front advancing in a rightward direction over a region in the drain layer 3 which is interposed between the main base region 4 and the underpad base region 5 (a region surrounded by a circle X shown in a one-dotted chain line). Consequently, a speed at which the depletion layer is expanded is also decreased comparatively.

Even if the built-in diode is caused to carry out the reverse recovery operation with high di/dt, the speed at which the depletion layer is expanded is decreased in the vicinity of the PN junction between the underpad base region 5 and the drain layer 4. Therefore, a carrier remaining in the drain layer 3 does not convergently flow into a specific portion in the main base region 4 which is close to the underpad base region 5 but uniformly flows into the whole main base region 4 comparatively gently. Accordingly, since the conduction of the parasitic bipolar transistor is suppressed, the di/dt tolerance of the semiconductor device 101 can further be enhanced.

Furthermore, in the case in which high dV/dt (a change rate of a voltage with the passage of time) is applied to the PN junction between the main base region 4 and the drain layer 3 which constitute the built-in diode, for example, in the case in which high dV/dt of approximately 1 kV/μs or more is applied between the drain electrode 14 and the source electrode 11 with the gate electrode 9 and the source electrode 111 short-circuited, the depletion layer is instantaneously expanded in the PN junction between the main base region 4 and the drain layer 3 so that a hole is generated depending on an area of the PN junction and a speed at which the depletion layer is expanded. On the other hand, the underpad base region 5 is set in the floating state in the PN junction between the underpad base region 5 and the drain layer 3. Consequently, the speed at which the depletion layer is expanded is decreased so that the hole to be generated is comparatively lessened. As a result, it is possible to suppress such a phenomenon that a current caused by the generation of the hole convergently flows into a specific portion in the main base region 4 which is close to the underpad base region 5. Consequently, the parasitic bipolar transistor constituted by the source region 6, the main base region 4 and the drain layer 3 is conducted with difficulty. Therefore, the dV/dt tolerance of the semiconductor device 101 can be enhanced. Alternatively, it is possible to suppress such a phenomenon that the current caused by the generation of the hole convergently flows into the gate electrode 9 through the gate insulating film 8 positioned in the vicinity of the underpad base region 5. Therefore, the gate insulating film 8 provided in the vicinity of the underpad base region 5 is influenced by the current with difficulty so that the dV/dt tolerance of the semiconductor device 101 can be enhanced.

A voltage to be applied between the drain electrode 14 and the source electrode 11, that is, a drain voltage is held by the depletion layer expanded from the PN junction between the main base region 4 and the drain layer 3 toward the inner part of the drain layer 3 when an inversion layer is not formed in the channel region of the main base region 4, that is, the semiconductor device 101 is set in an OFF state. A maximum value of the voltage to be held specifies a breakdown voltage of the semiconductor device 101. In the semiconductor device 101, since the main base region 4 is formed to be shallower than the underpad base region 5, an effective distance (an arrow Y shown in a one-dotted chain line) at which the depletion layer is expanded from the PN junction between the main base region 4 and the drain layer 3 toward the inner part of the drain layer 3 is increased as shown in FIG. 3. Consequently, the breakdown voltage of the semiconductor device 101 can be enhanced.

Moreover, the conductive layer 10 is buried in the insulating layer 7 provided under the gate pad 12 to be opposed to the upper main surface of the semiconductor substrate 1. For this reason, when a backward bias is applied to the built-in diode as shown in FIG. 3, the depletion layer is expanded toward the inner part of the drain layer 3 while holding an almost parallel configuration with the upper main surface in a region provided under the gate pad 12. More specifically, the expansion of the depletion layer toward the inner part of the drain layer 3 becomes almost uniform in the region provided under the gate pad 12. Accordingly, a portion in which a critical electric field strength is reached is generated with difficulty. Therefore, the breakdown voltage can further be enhanced.

Furthermore, the conductive layer 10 is extended up to a portion provided above the main base region 4. Therefore, the effect of a field plate reaches a portion in an exposed surface of the drain layer 3 which is interposed between the main base region 4 and the underpad base region 5.

It is preferable that an impurity concentration of the main base region 4 should be set to be lower than that of the underpad base region 5. Consequently, when the semiconductor device 101 is set in the OFF state, the depletion layer holding the drain voltage is also expanded easily toward an inner part of the main base region 4. As a result, the electric field strength in the depletion layer is relieved, and particularly, an electric field strength of a curved portion (a circle Z shown in a one-dotted chain line of FIG. 3) in the main base region 4 is relieved. Therefore, the breakdown voltage can further be enhanced.

Figure 4:
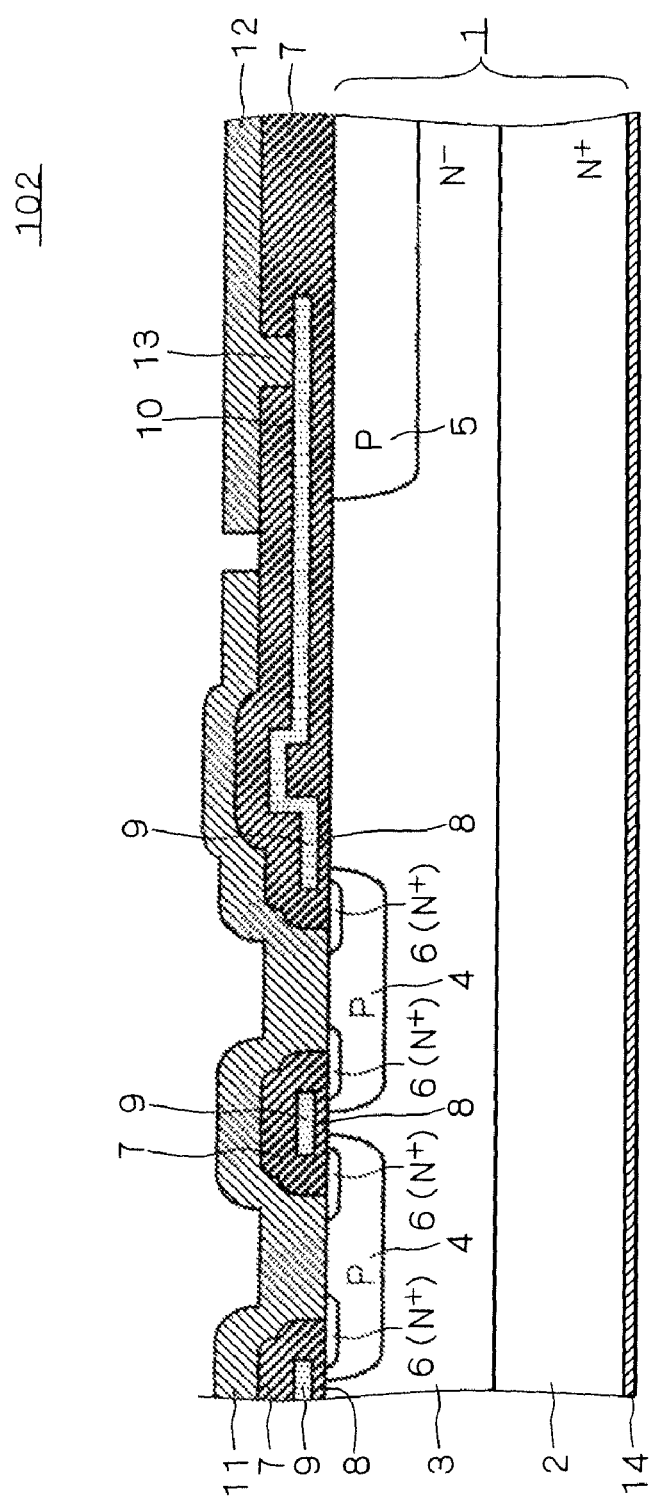
FIG. 4 is a longitudinal sectional view showing a semiconductor device according to another example of the first embodiment.

As in a semiconductor device 102 shown in FIG. 4, a distance between the underpad base region 5 and the main base region 4 may be maintained to be great. Consequently, a density of a current is reduced against an area of the semiconductor substrate 1, while a concentration of the current in the specific portion of the main base region 4 is further suppressed and the di/dt tolerance can further be enhanced.

Second Embodiment

Figure 5:
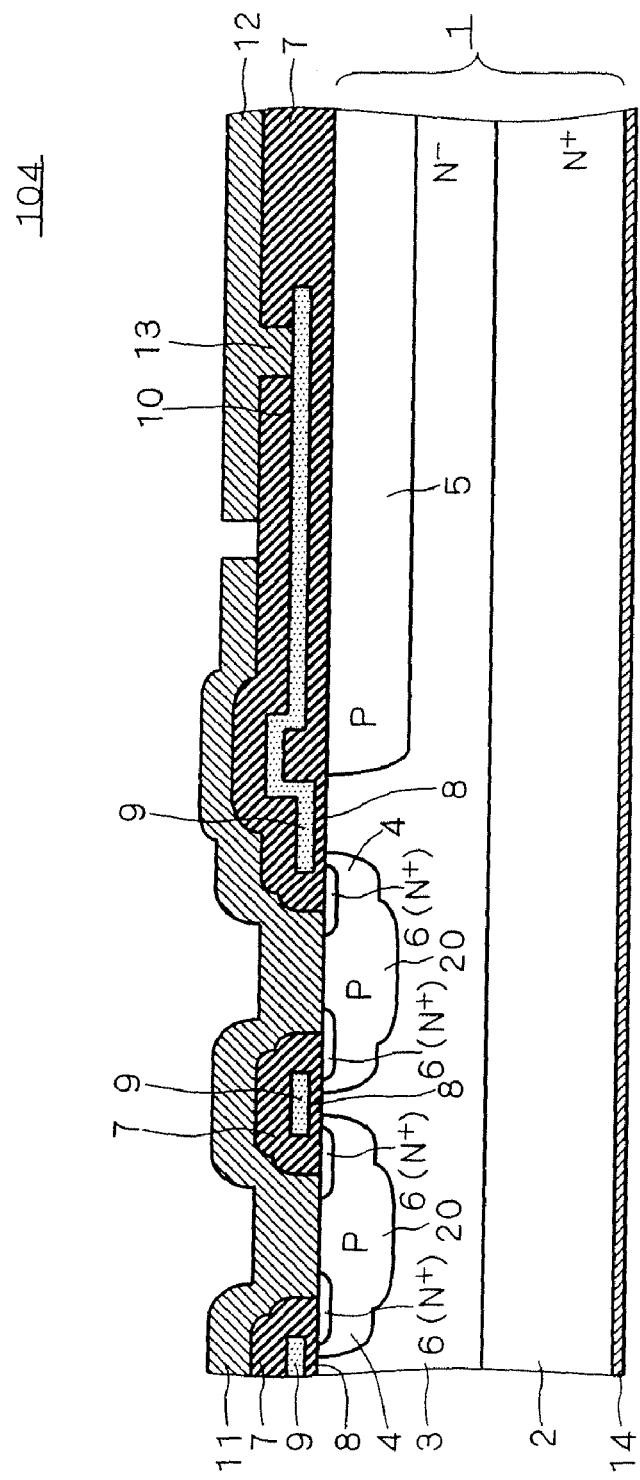
FIG. 5 is a longitudinal sectional view showing a semiconductor device according to a second embodiment.

FIG. 5 is a sectional view showing a semiconductor device according to a second embodiment of the present invention. A plan view showing the vicinity of a gate pad 12 in a semiconductor device 104 is equivalent to FIG. 1. FIG. 5 corresponds to a sectional view showing the semiconductor device 104 taken along a cutting line A-A in FIG. 1. The semiconductor device 104 is characteristically different from the semiconductor device 101 in that a main base region 4 has, on a bottom face, a projection 20 protruded selectively toward a lower main surface.

When the semiconductor device 104 is turned OFF in a state of a connection to an inductive load, a surge voltage appears in a drain voltage. When the surge voltage exceeds a breakdown voltage, an avalanche current flows to a semiconductor substrate 1. The avalanche current contributes as a base current of a parasitic bipolar transistor formed by a source region 6, a main base region 4 and a drain layer 3. In the conventional semiconductor device 151, therefore, the parasitic bipolar transistor is conducted due to the avalanche current in some cases. In the semiconductor device 104, however, the projection 20 is provided in the main base region 4. Therefore, an electric field generated on a depletion layer is selectively increased in the projection 20. For this reason, since the avalanche current uses the projection 20 as a main path, a component of the avalanche current flowing in a portion in the main base region 4 which is provided under the source region 6 is decreased. More specifically, a component to contribute as a base current of the parasitic bipolar transistor is reduced. As a result, the conduction of the parasitic bipolar transistor is suppressed. Thus, it is possible to implement a stable operation under operating conditions in which an inductive load having a great inductance is connected.

Figure 6:
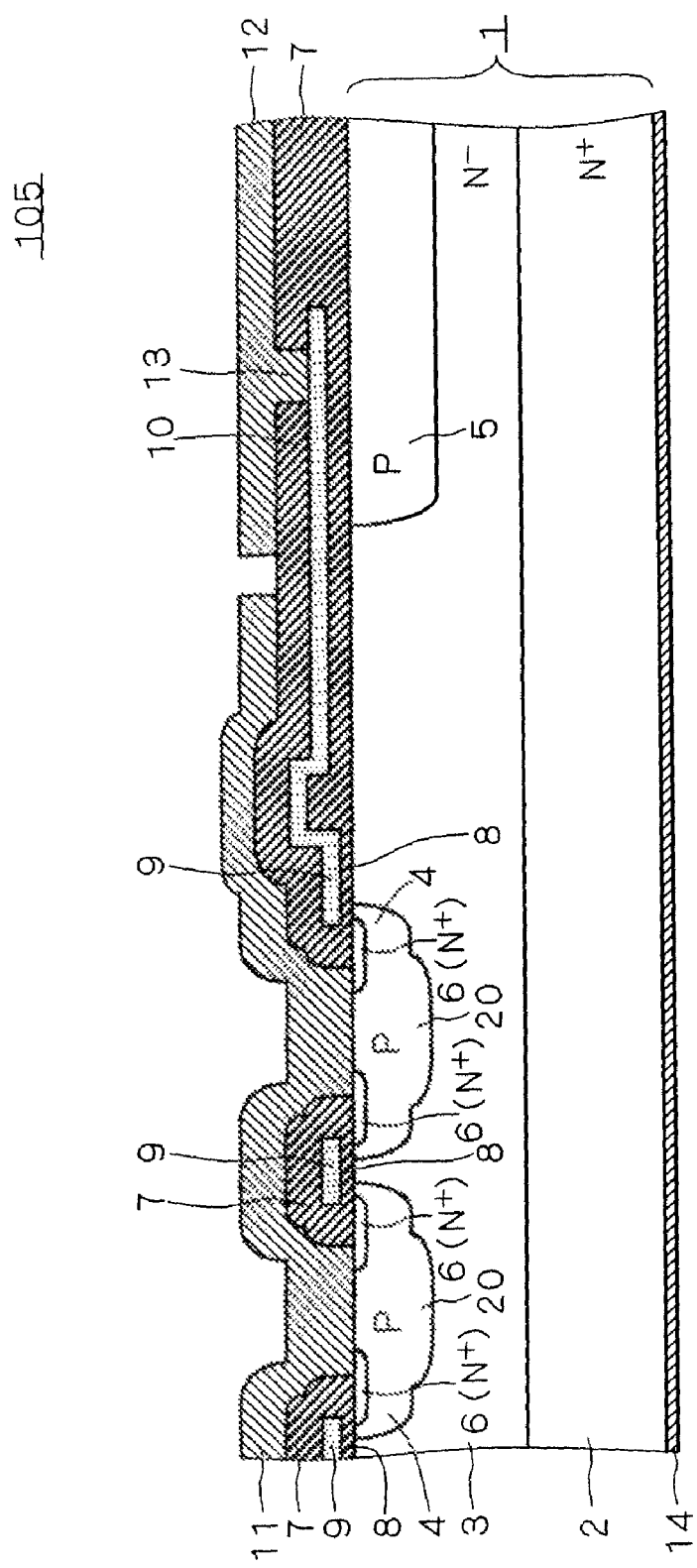
FIG. 6 is a longitudinal sectional view showing a semiconductor device according to another example of the second embodiment.

Also in the semiconductor device 104, it is possible to carry out a variant (a semiconductor device 105 in FIG. 6) in which a distance between the underpad base region 5 and the main base region 4 is maintained to be great in the same manner as in the semiconductor device 101.

Third Embodiment

Figure 7:
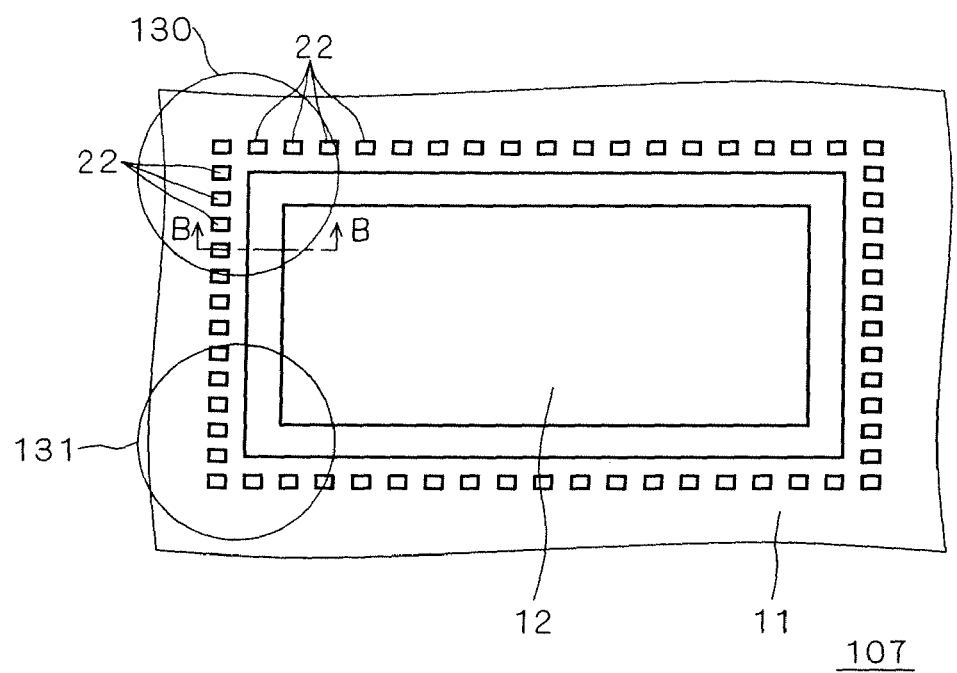
FIG. 7 is a partial plan view showing a semiconductor device according to a third embodiment.
Figure 8:
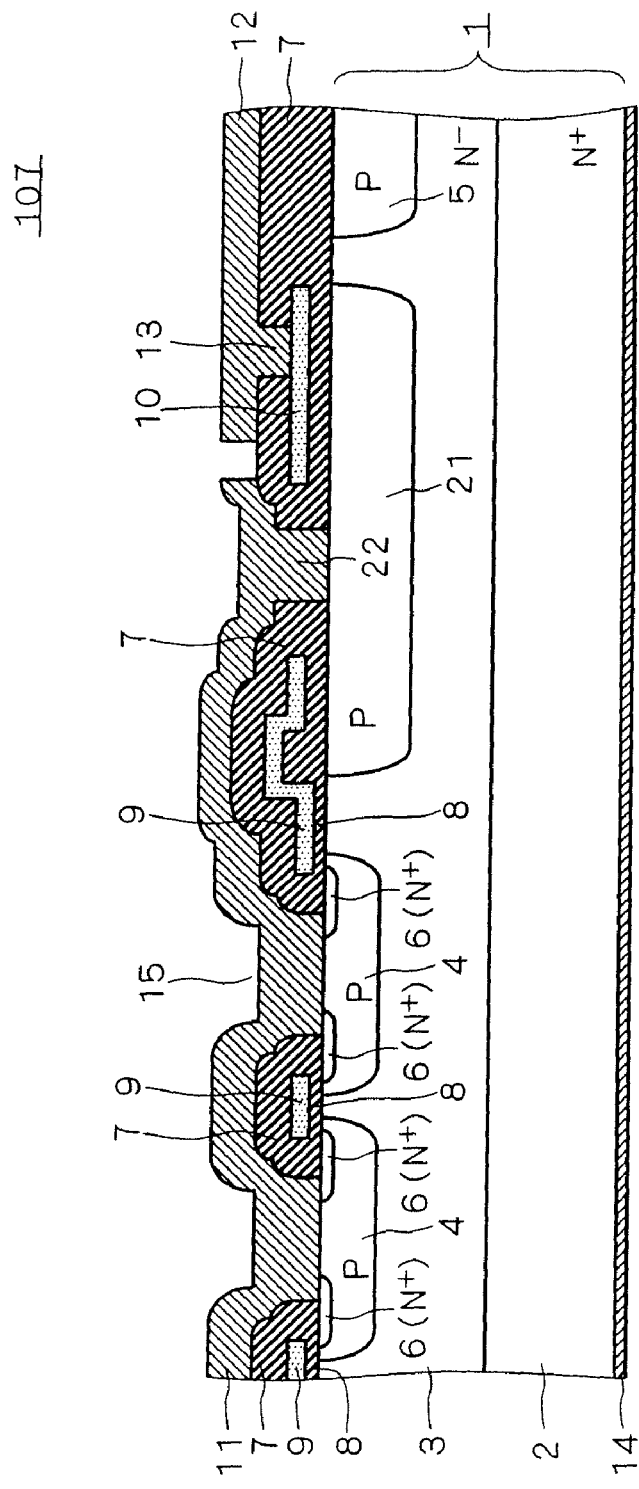
FIG. 8 is a longitudinal sectional view showing the semiconductor device according to the third embodiment.

FIG. 7 is a partial plan view showing a part of a semiconductor device according to a third embodiment of the present invention. A plan view showing a semiconductor device 107 is the same as FIG. 25, for example. As shown in FIG. 7, a source electrode 11 is provided around a gate pad 12. The source electrode 11 is connected to a semiconductor substrate through a plug 22 penetrating an insulating layer. FIG. 8 is a sectional view showing the semiconductor device 107 taken along a cutting line B-B in FIG. 7. The semiconductor device 107 is characteristically different from the semiconductor device 101 in that a P type peripheral base region 21 is provided between a main base region 4 and an underpad base region 5.

The peripheral base region 21 is selectively formed in a drain layer 3 to be shallower than the drain layer 3 and is exposed to an upper main surface of a semiconductor substrate 1. The peripheral base region 21 is positioned between the main base region 4 and the underpad base region 5 and is not coupled to the underpad base region 5. The source electrode 11 is connected to the main base region 4 and is also connected to the peripheral base region 21 through the plug 22 penetrating an insulating layer 7. However, an N type semiconductor region such as a source region 6 is not provided in the peripheral base region 21. Accordingly, a channel region is not present in the peripheral base region 21.

Figure 9:
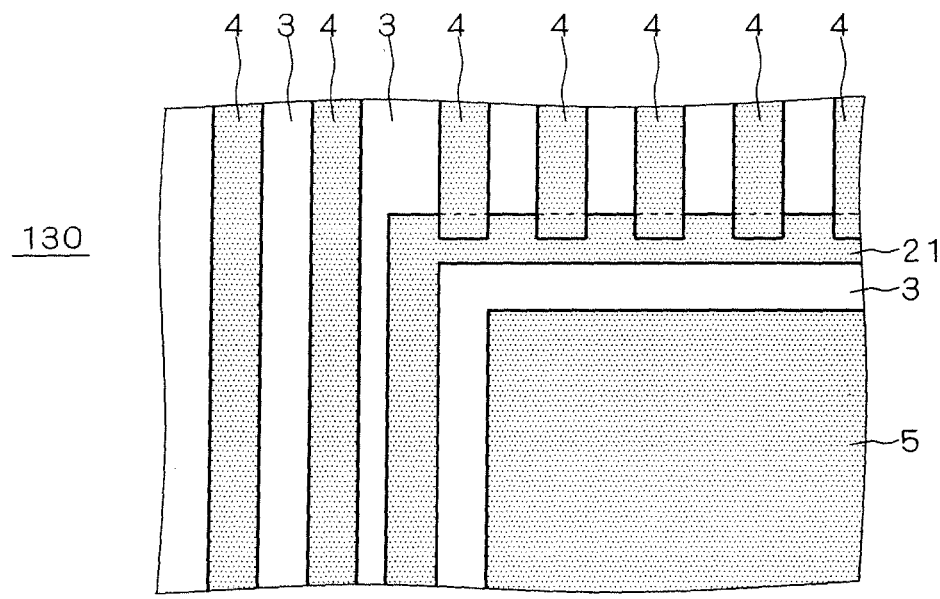
FIG. 9 is a partial enlarged plan view showing the semiconductor device according to the third embodiment.
Figure 10:
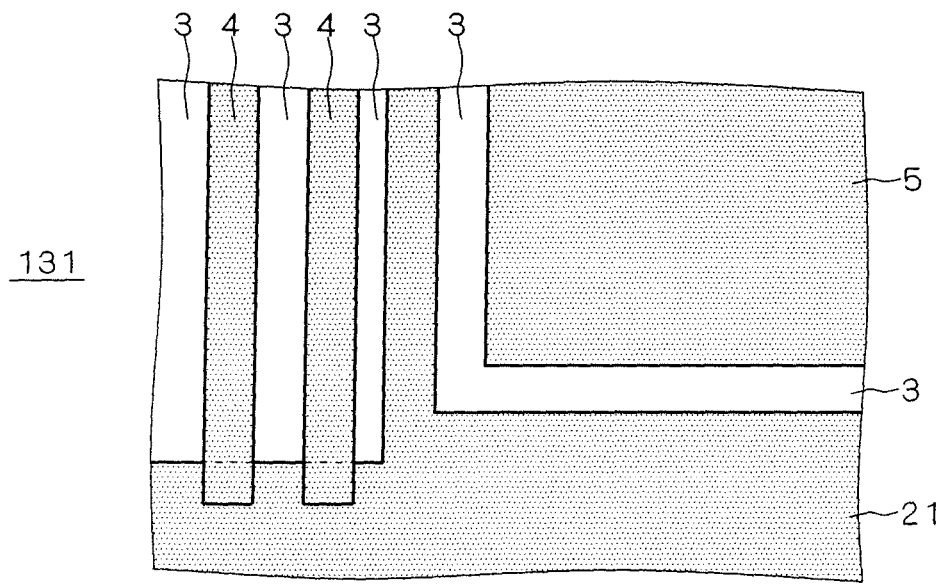
FIG. 10 is a partial enlarged plan view showing the semiconductor device according to the third embodiment.

FIGS. 9 and 10 are partially enlarged plan views showing enlarged portions 130 and 131 in FIG. 7, respectively. As shown in FIGS. 9 and 10, the peripheral base region 21 includes an annular portion formed to continuously surround a periphery of the underpad base region 5 positioned under the gate pad 12. The peripheral base region 21 shown in FIG. 8 corresponds to the annular portion and the annular portion is positioned between the main base region 4 and the underpad base region 5 as described above. Furthermore, the peripheral base region 21 is coupled to one end of each of a plurality of regions obtained by a division of the main base region 4 through the annular portion as shown in FIG. 9, and furthermore, a portion other than the annular portion as shown in FIG. 10. In examples shown in FIGS. 9 and 10, the main base region 4 is divided into a large number of parallel band-shaped regions, each of the regions having one end to which the peripheral base region 21 is coupled.

Since the semiconductor device 107 is constituted as described above, it is operated in the following manner. The peripheral base region 21 is the same as the main base region 4 in that it is not coupled to the underpad base region 5 but is connected to the source electrode 11. Accordingly, a built-in diode is constituted by a PN junction between the main base region 4 and the drain layer 3 and a PN junction between the peripheral base region 21 and the drain layer 3.

Even if holes are injected from the underpad base region 5 into the drain layer 3 when the built-in diode is conducted, the residual holes mainly go to the source electrode 11 through the peripheral base region 21 in place of the main base region 4 when the built-in diode carries out a reverse recovery operation. Furthermore, the residual holes generated from a portion in the main base region 4 which is close to the peripheral base region 21 flow to the source electrode 111 through the peripheral base region 21 in addition to the main base region 4. Thus, it is possible to suppress such a phenomenon that the residual holes convergently flow into a specific portion in the main base region 4 which is close to the underpad base region 5 when the built-in diode carries out the reverse recovery operation. Consequently, the residual holes can be annihilated efficiently.

Since an N type semiconductor region is not formed in the peripheral base region 21 differently from the main base region 4, a parasitic bipolar transistor is not constituted. Accordingly, the residual holes flowing through the peripheral base region 21 do not contribute as a base current of the parasitic bipolar transistor. As a result, even if the built-in diode is caused to carry out the reverse recovery operation with high di/dt, the conduction of the parasitic bipolar transistor can be suppressed so that a di/dt tolerance can further be enhanced.

Moreover, in the case in which high dV/dt is applied to a PN junction between the main base region 4 and the drain layer 3 which constitute the built-in diode, for example, in the case in which high dV/dt of approximately 1 kV/µs or more is applied between a drain electrode 14 and the source electrode 111 with a gate electrode 9 and the source electrode 11 short-circuited, a current obtained by the generated hole flows to the source electrode 11 through the peripheral base region 21 positioned in the vicinity of the underpad base region 5 in addition to the fact that the number of the generated holes is small because the underpad base region 5 is set in the floating state as described in the first embodiment.

As a result, it is possible to further suppress such a phenomenon that a current convergently flows into a specific portion in the main base region 4 which is close to the underpad base region 5. Consequently, the parasitic bipolar transistor constituted by the source region 6, the main base region 4 and the drain layer 3 is conducted with difficulty. Therefore, the dV/dt tolerance of the semiconductor device 107 can further be enhanced. Alternatively, it is possible to suppress such a phenomenon that a current caused by the generation of the hole convergently flows into the gate electrode 9 through the gate insulating film 8 positioned in the vicinity of the underpad base region 5. Consequently, the gate insulating film 8 provided in the vicinity of the underpad base region 5 is influenced by the current with difficulty so that the dV/dt tolerance of the semiconductor device 107 can further be enhanced.

When the built-in diode is conducted, the hole is injected from the main base region 4 and the peripheral base region 21 into the drain layer 3. However, the peripheral base region 21 is coupled to one end of each of a plurality of regions constituting the main base region 4. Therefore, also when the built-in diode is caused to carry out a reverse recovery operation with high di/dt, it is possible to effectively relieve such a phenomenon that the residual hole convergently flows to a specific portion of the main base region 4. Thus, the residual hole flows over the whole main base region 4 and peripheral base region 21 comparatively uniformly. As a result, the di/dt tolerance can further be increased.

The peripheral base region 21 has an annular portion along an outer periphery of a region corresponding to a portion provided under the gate pad 12. Therefore, the hole generated from the main base region 4 in the conduction of the built-in diode flows to the peripheral base region 21 efficiently when the built-in diode carries out the reverse recovery operation. Accordingly, it is possible to suppress such a phenomenon that the residual hole convergently flows into a specific portion in the main base region 4 which is close to the region corresponding to the portion provided under the gate pad 12 when the built-in diode is caused to carry out the reverse recovery operation with a high di/dt tolerance. Consequently, the di/dt tolerance can further be enhanced.

Furthermore, the gate electrode 9 to be connected to the conductive layer 10 also covers a portion in an exposed surface of the drain layer 3 which is interposed between the main base region 4 and the peripheral base region 21. Therefore, the effect of a field plate reaches a portion in the exposed surface of the drain layer 3 which is interposed between the main base region 4 and the peripheral base region 21. Moreover, the gate pad 12 also covers the portion in the exposed surface of the drain layer 3 which is interposed between the underpad base region 5 and the peripheral base region 21. Therefore, the effect of the field plate obtained by the gate pad 12 also reaches the portion in the exposed surface of the drain layer 3 which is interposed between the underpad base region 5 and the peripheral base region 21.

Figure 11:
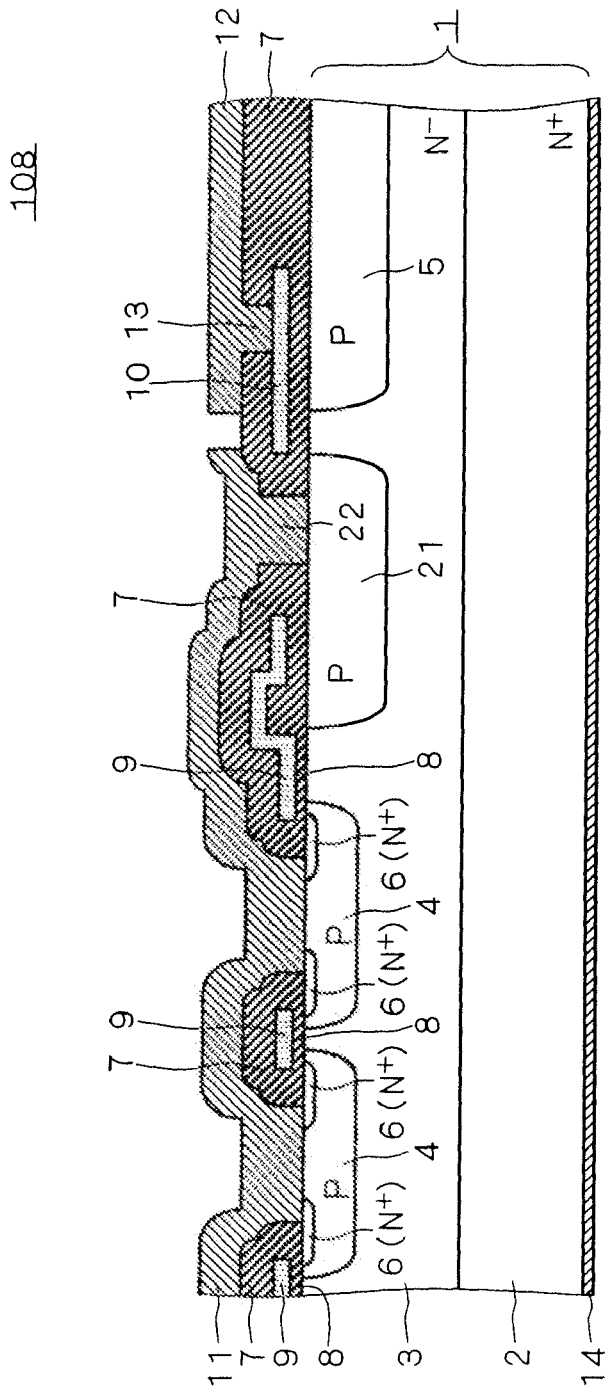
FIG. 11 is a longitudinal sectional view showing the semiconductor device according to another example of the third embodiment.

As in a semiconductor device 108 shown in FIG. 11, a distance between the underpad base region 5 and the main base region 4 may be set to be small, and correspondingly, a width of the peripheral base region 21 interposed between the underpad base region 5 and the main base region 4 may be set to be small. Consequently, a density of a current is increased against an area of the semiconductor substrate 1. In the semiconductor device 108, moreover, the conductive layer 10 also covers the portion in the exposed surface of the drain layer 3 which is interposed between the underpad base region 5 and the peripheral base region 21. Therefore, the effect of the field plate obtained by the conductive layer 10 also reaches the portion in the exposed surface of the drain layer 3 which is interposed between the underpad base region 5 and the peripheral base region 21.

Fourth Embodiment

Figure 12:
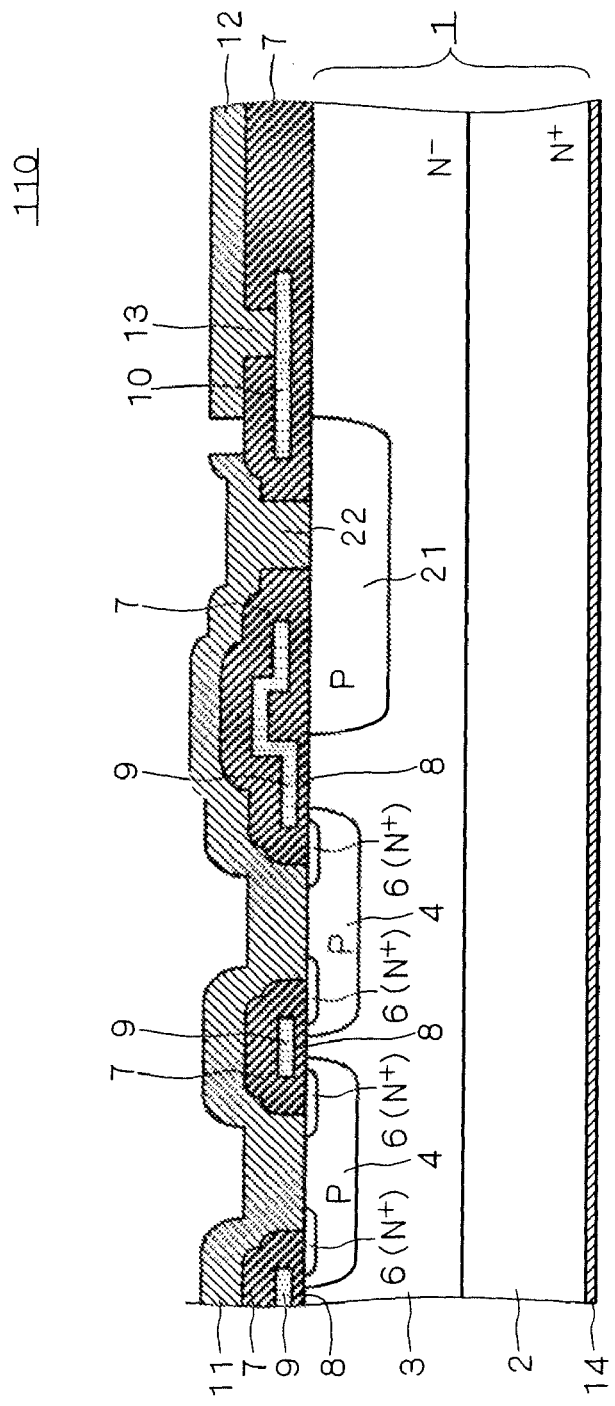
FIG. 12 is a longitudinal sectional view showing a semiconductor device according to a fourth embodiment.

FIG. 12 is a sectional view showing a semiconductor device according to a fourth embodiment of the present invention. A plan view showing the vicinity of a gate pad 12 in a semiconductor device 110 is equivalent to FIG. 7. FIG. 12 corresponds to a sectional view showing the semiconductor device 110 taken along a cutting line B-B in FIG. 7. The semiconductor device 110 is characteristically different from the semiconductor device 107 in that an underpad base region 5 is not provided. More specifically, the gate pad 12 is opposed to a region of an upper main surface of a semiconductor substrate 1 to which a drain layer 3 is exposed. Also in the semiconductor device 110, as shown in FIGS. 9 and 10, a peripheral base region 21 has an annular portion formed continuously along an outer periphery of a region corresponding to a portion provided under the gate pad 12.

In the semiconductor device 110, the gate pad 12 is opposed to the drain layer 3. Therefore, a magnitude of a capacitance $C_{DS}$ between a drain and a source is different from that of the semiconductor device 107. For this reason, in the case in which a difference is made between the semiconductor devices 107 and 110 in relation to a magnitude of a current flowing transiently (for example, a displacement current or a Hall current) when high dV/dt is applied between a drain electrode 14 and a source electrode 11. Resulting from the difference, in the semiconductor substrate 110, a higher dV/dt tolerance can be obtained as compared with that in the semiconductor device 107.

Figure 13:
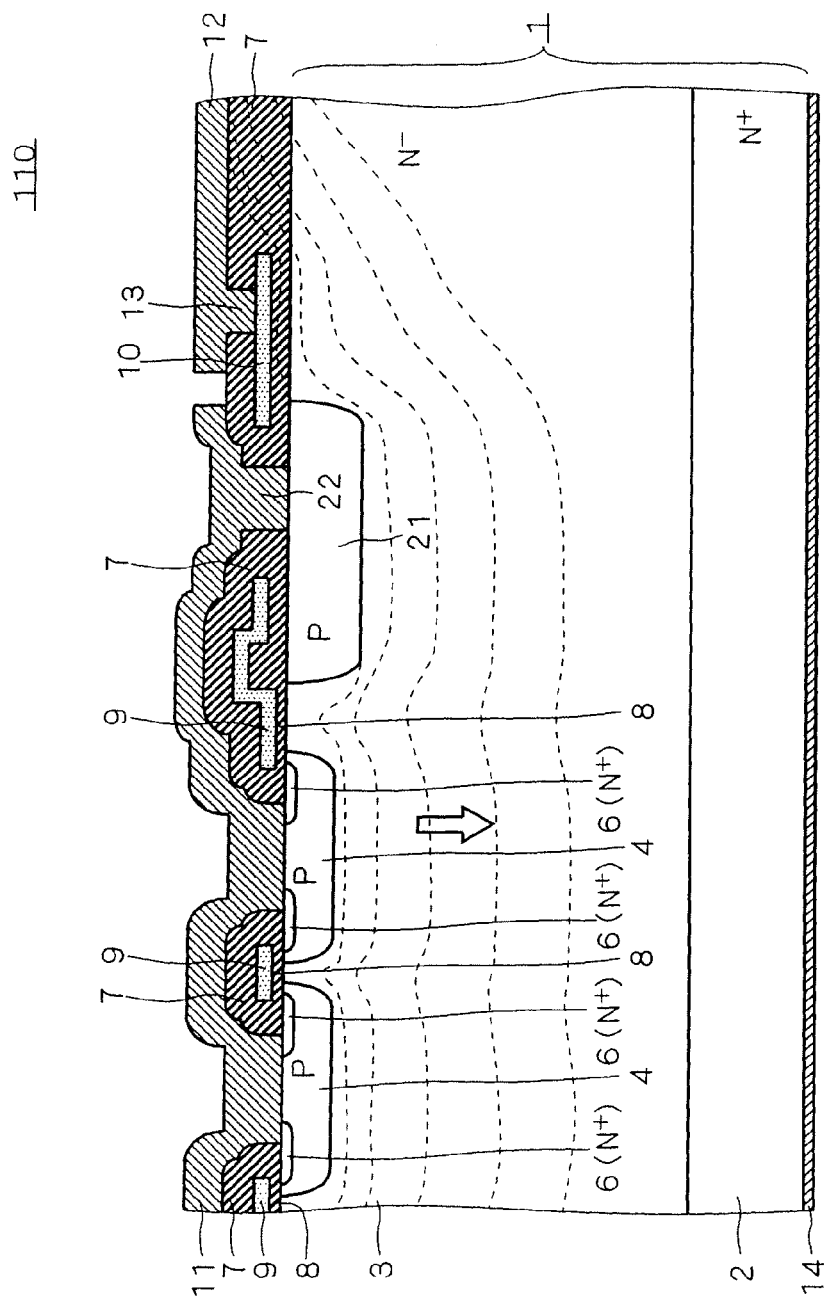
FIG. 13 is a view illustrating an operation of the semiconductor device according to the fourth embodiment.

Moreover, a conductive layer 10 is buried in an insulating layer 7 provided under the gate pad 12 to be opposed to an upper main surface of the semiconductor substrate 1. For this reason, when a backward bias is applied to the built-in diode as shown in FIG. 13, the depletion layer is expanded toward an inner part of the drain layer 3 while holding an almost parallel configuration with the upper main surface in the region provided under the gate pad 12. More specifically, the expansion of the depletion layer into the drain layer 3 becomes almost uniform in the region provided under the gate pad 12. Accordingly, since a portion in which a critical electric field strength is reached is generated with difficulty, a breakdown voltage can further be enhanced.

Furthermore, since the conductive layer 10 is connected to the gate pad 12, the function of a field plate obtained by the gate pad 12 and the conductive layer 10 is increased still more. Consequently, the expansion of the depletion layer into the drain layer 3 becomes much more uniform in the region provided under the gate pad 12. As a result, the breakdown voltage of the semiconductor device can further be enhanced.

As shown in FIG. 12, furthermore, the conductive layer 10 is extended to reach an upper part of the peripheral base region 21. When a backward bias is applied to a built-in diode and the depletion layer to be expanded into the drain layer 3 reaches one end of the peripheral base region 21, therefore, the depletion layer also reaches the other end rapidly. More specifically, the depletion layer is expanded while maintaining an almost parallel configuration with the upper main surface including the periphery 21 of the peripheral base region. Accordingly, since the expansion of the depletion layer becomes almost uniform more effectively, it is possible to more effectively prevent the generation of the portion in which the critical electric field strength is reached. As a result, the breakdown voltage of the semiconductor device can be increased more effectively.

Figure 14:
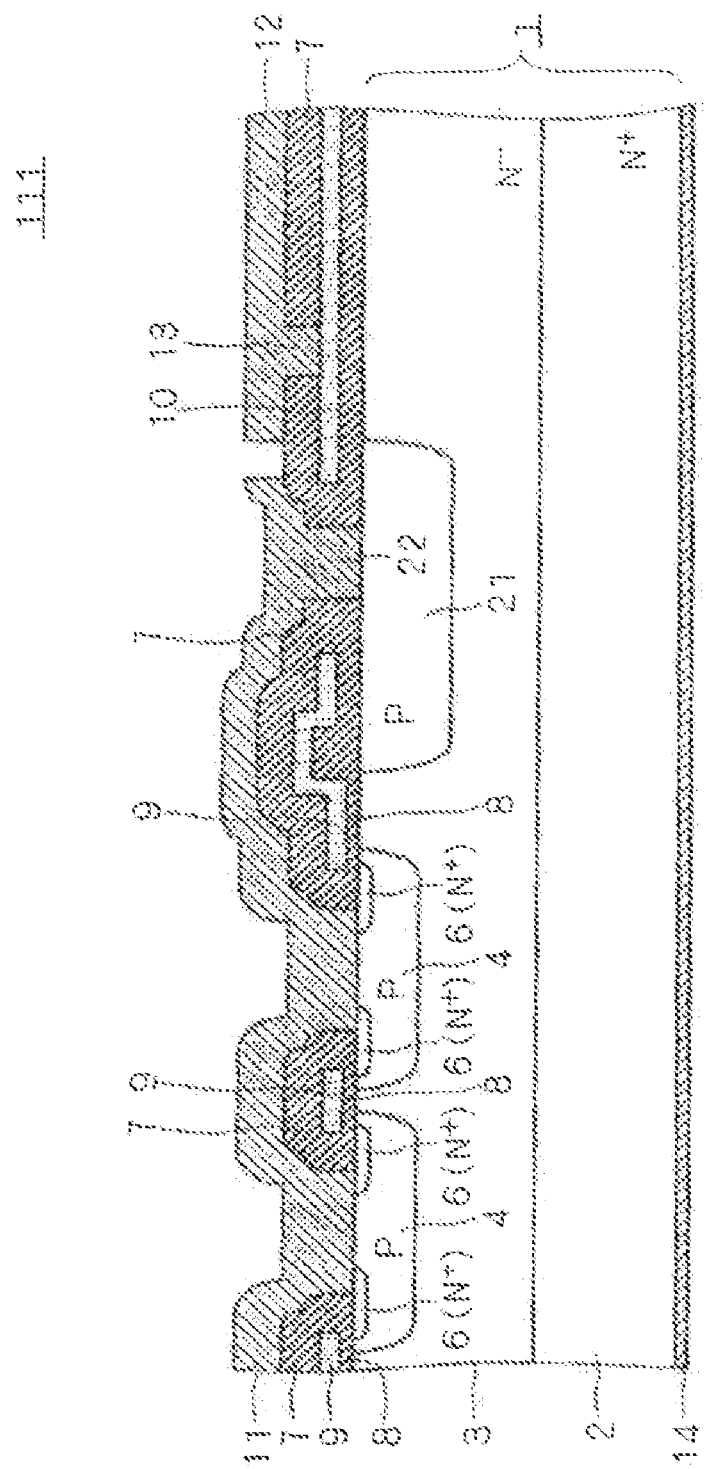
FIG. 14 is a longitudinal sectional view showing a semiconductor device according to another example of the fourth embodiment.
Figure 15:
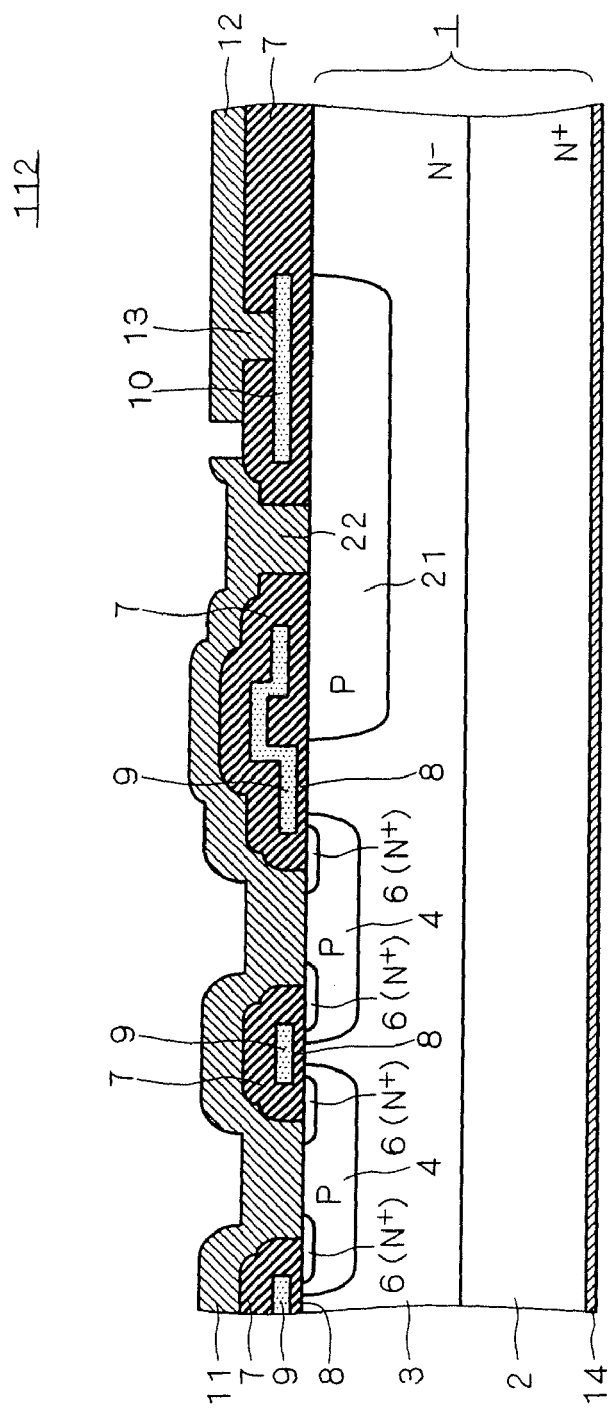
FIG. 15 is a longitudinal sectional view showing a semiconductor device according to yet another example of the fourth embodiment.
Figure 16:
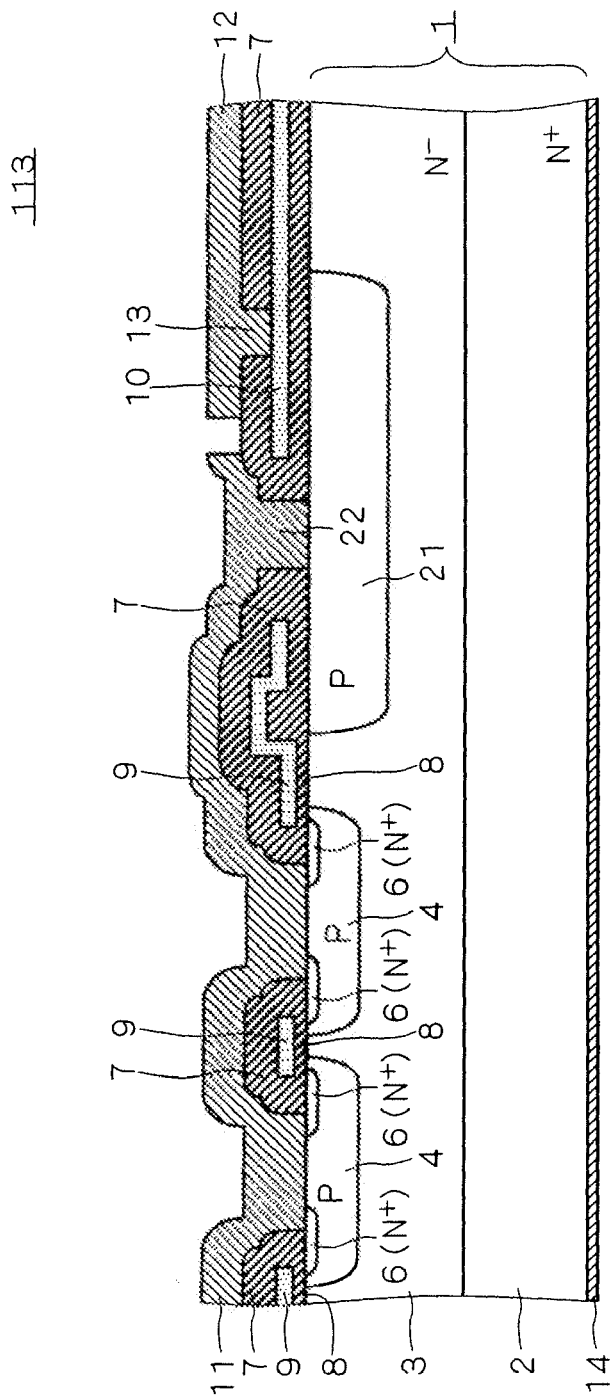
FIG. 16 is a longitudinal sectional view showing a semiconductor device according to a further example of the fourth embodiment.

As in a semiconductor device 111 shown in FIG. 14, the conductive layer 10 may be formed more widely. Consequently, the function of the conductive layer 10 to be the field plate is further increased so that the breakdown voltage can further be enhanced. As in a semiconductor device 112 shown in FIG. 15 or a semiconductor device 113 shown in FIG. 16, moreover, it is also possible to maintain a width of the peripheral base region 21 to be great. In the semiconductor device 112 shown in FIG. 15, a portion in an exposed surface of the drain layer 3 which is covered by the underpad base region 5 is not covered by the conductive layer 10 but an effect of the field plate obtained by the underpad base region 5 can be obtained.

Fifth Embodiment

In the semiconductor devices 101 to 113 described above, it is desirable that a resistivity of a drain layer 3 should have such a gradient as to be more decreased when an upper main surface of a semiconductor substrate 1 is more distant as shown in a resistivity profile of FIG. 17. Consequently, when a built-in diode carries out a reverse recovery operation, a speed at which a depletion layer is expanded is more decreased when the depletion layer is more expanded. As shown in a waveform diagram of FIG. 18, therefore, a voltage change rate dV/dt is reduced when the built-in diode carries out the reverse recovery operation. More specifically, a change in a drain voltage to be applied between a drain electrode 14 and a source electrode 11 becomes gentle. In FIG. 18, a solid line indicates a waveform obtained when the resistivity of the drain layer 3 has no gradient and a dotted line indicates a waveform obtained when the same resistivity has the gradient.

Even if holes remain in a region provided under a gate pad 12, accordingly, it is possible to suppress such a phenomenon that the residual holes convergently flow into a specific portion in a main base region 4 which is close to the region provided under the gate pad 12. As a result, the residual holes flow comparatively uniformly over the whole main base region by taking time. Consequently, even if the built-in diode is caused to carry out the reverse recovery operation with high di/dt, a parasitic bipolar transistor is conducted with difficulty. Therefore, the di/dt tolerance of the semiconductor device can be enhanced.

Furthermore, when the built-in diode is caused to carry out the reverse recovery operation with high di/dt, a speed at which a depletion layer is expanded is decreased so that a voltage change rate dV/dt is also reduced. Accordingly, since a change in a drain voltage becomes gentle, the reverse recovery operation approximates to a soft recovery (a waveform diagram showing a current I in a dotted line of FIG. 18). Consequently, such a phenomenon that a surge voltage is generated between main electrodes can be relieved or suppressed.

In addition, since the resistivity of the drain layer becomes lower when the upper main surface of the semiconductor substrate is more distant, a bulk resistance of the drain layer is reduced. Accordingly, it is also possible to obtain such an effect that an ON resistance of the semiconductor device is reduced.

The resistivity profile in FIG. 17 can easily be obtained by forming the semiconductor substrate 1 in accordance with views of FIGS. 19 to 21 showing a process. More specifically, in a process for forming the semiconductor substrate 1, an N⁻ type semiconductor substrate 60 is prepared (FIG. 19) and an N type impurity having a high concentration is then deposited on both main surfaces of a semiconductor substrate 60 and is further diffused, thereby forming a set of N⁺ type high concentration drain layers 2 and an N⁻ type semiconductor layer 61 interposed therebetween (FIG. 20). As shown in FIG. 21, next, the semiconductor layer 61 is cut in a portion shown in a broken line so that the semiconductor substrate 1 having the high concentration drain layer 2 and the drain layer 3 can be obtained.

Figure 22:
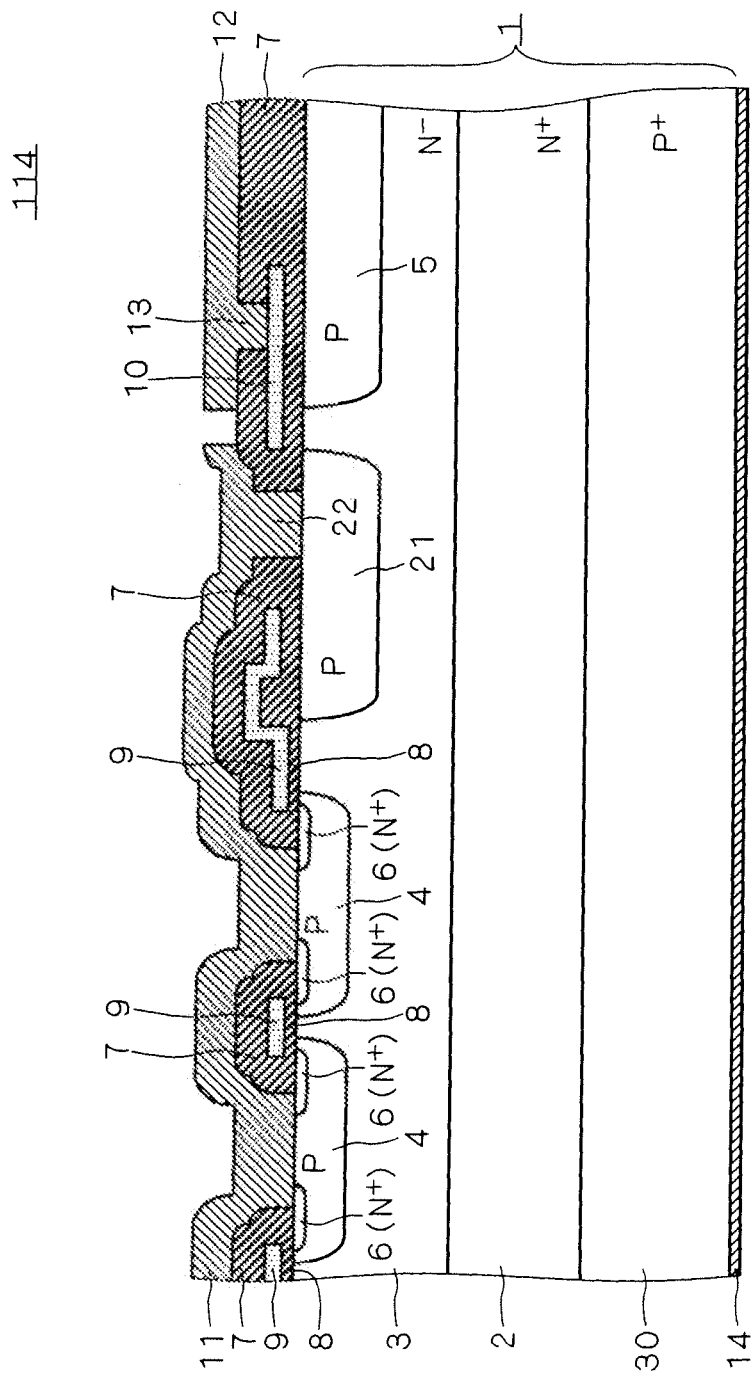
FIG. 22 is a longitudinal sectional view showing a semiconductor device according to a variant.
Figure 23:
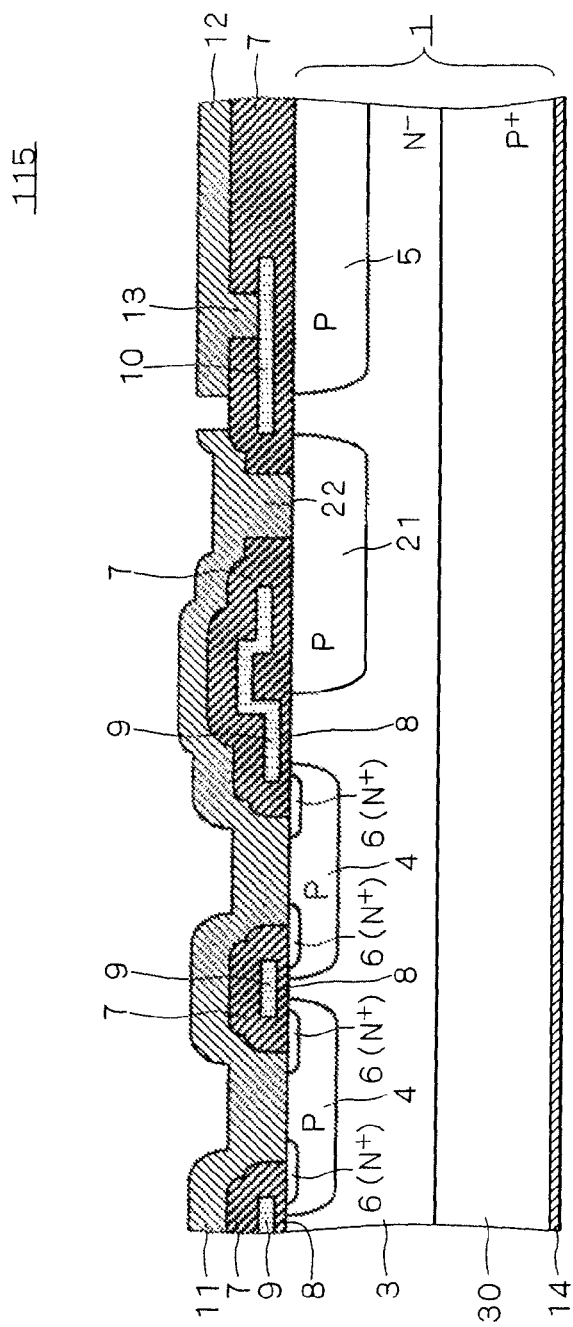
FIG. 23 is a longitudinal sectional view showing a semiconductor device according to another variant.

Variant (1) In the semiconductor devices 101 to 113 described above, it is also possible to constitute an IGBT by adding a collector layer to the semiconductor substrate 1. A semiconductor device 114 shown in FIG. 22 corresponds to an example in which the IGBT is constituted by adding a P⁺ type collector layer 30 to the semiconductor device 108. The collector layer 30 is exposed to a lower surface of the semiconductor substrate 1 and is connected to a collector electrode 14 (a source electrode and a drain electrode in an MOSFET correspond to an emitter electrode and a collector electrode in the IGBT, respectively). As in a semiconductor device 115 shown in FIG. 23, it is also possible to constitute an IGBT from which a high concentration drain layer 2 is removed. Also in the IGBT thus constituted, an MOSFET having the same characteristics as those of the semiconductor devices 101 to 113 is included on the upper main surface side of the semiconductor substrate 1. Therefore, the same effects as those in the semiconductor devices 101 to 113 can be obtained in relation to a dV/dt tolerance and a breakdown voltage. In the IGBT, furthermore, it is possible to further obtain such an advantage that an ON resistance can be reduced effectively by a conductivity modulation effect.

(2) As shown in FIG. 24, the present invention can also be applied to a semiconductor device of a trench type as well as a plane type. FIG. 24 illustrates an MOSFET of a trench type. In the semiconductor devices 101 to 115, a region having the main base region 4 can be replaced with a structure shown in FIG. 24. In the example of FIG. 24, a trench 40 opened to an upper main surface of a semiconductor substrate 1 is formed to reach a drain layer 3. An inner wall of the trench 40 is covered with a gate insulating film 8 and a gate electrode 9 is buried in the gate insulating film 8. An upper surface of the gate electrode 9 is covered with an insulating layer 7 and an upper surface of the insulating layer 7 is covered with a source electrode 11.

(3) While the N channel type semiconductor device has been taken in the above description, the present invention can also be applied to a P channel type semiconductor device. In each semiconductor device described above, it is possible to constitute a P channel type semiconductor device by inverting a conductivity type of each semiconductor layer or each semiconductor region.

While the present invention has been described in detail, the above description is illustrative in all aspects and the present invention is not restricted thereto. It is understood that numerous variants which are not illustrated can be supposed without departing from the scope of the present invention.

What is claimed:

1. A semiconductor device comprising:
a semiconductor substrate having an upper main surface and a lower main surface, said semiconductor substrate including:
   a drain layer of a first conductivity type formed in said upper main surface,
   a main base region of a second conductivity type selectively formed in said drain layer to be shallower than said drain layer and exposed to said upper main surface,
   an underpad base region of a second conductivity type selectively formed in said drain layer to be shallower than said drain layer, exposed to said upper main surface and not coupled to said main base region, and a distance between said main base region and said underpad base region along said drain layer is larger than a size of said main base region,
   a source region of a first conductivity type selectively formed in said main base region to be shallower than said main base region and exposed to said upper main surface, and
   a peripheral base region of a second conductivity type selectively formed in said drain layer to be shallower than said drain layer, exposed to said upper main surface, said peripheral base region being positioned between said main base region and said underpad base region, not having a semiconductor region of a first conductivity type provided therein, and is not coupled to said underpad base region;
a first main electrode connected to said main base region, said peripheral base region and said source region and not connected to said underpad base region;
a gate electrode opposed to a channel region in said main base region interposed between said drain layer and said source region with a gate insulating film provided therebetween;
a conductive gate pad opposed to an exposed surface of said underpad base region in said upper main surface with an insulating layer interposed therebetween and said conductive gate pad is connected to said gate electrode;
a conductive layer buried in the insulating layer to be opposed to said upper main surface in a vertical position closer to the upper main surface than the conductive gate pad, the conductive layer being extended to reach a location above the peripheral base region; and
a second main electrode connected to said lower main surface,
wherein a maximal depth of the main base region from the upper main surface of the substrate is shallower than a maximal depth of the underpad base region.

2. The semiconductor device according to claim 1,
wherein the main base region includes a first main base region and a second main base region, the first and second main base regions arranged in the drain layer adjacent to each other such that a portion of both the first and second main base region are arranged underneath the gate electrode, the first and second main base regions each having at least one of the source region arranged therein.

* * * * *